United States Patent

Schuster et al.

[11] Patent Number: 5,870,412
[45] Date of Patent: Feb. 9, 1999

[54] FORWARD ERROR CORRECTION SYSTEM FOR PACKET BASED REAL TIME MEDIA

[75] Inventors: Guido M. Schuster, Des Plaines; Jerry Mahler, Prospect Heights; Ikhlaq Sidhu, Buffalo Grove; Michael Borella, Naperville, all of Ill.

[73] Assignee: 3Com Corporation, Santa Clara, Calif.

[21] Appl. No.: 989,483

[22] Filed: Dec. 12, 1997

[51] Int. Cl.[6] .................................................. G06F 11/00
[52] U.S. Cl. .......................................................... 371/37.01
[58] Field of Search ................................ 371/37.01, 37.7, 371/38.1, 39.1

[56] References Cited

U.S. PATENT DOCUMENTS 5,115,436  5/1992  McAuley .
5,608,738  3/1997  Matsushita .

OTHER PUBLICATIONS

McAuley, Anthony J., "Reliable Broadband Communication Using A Burst Erasure Correcting Code", Bellcore Computer Communication Research Group (1990), pp. 297–306.

Nonenmacher, Jorg et al., "Parity–Based Loss Recovery for Reliable Multicast Transmission" (1997), pp. 289–300.

Feher, Kamilo "Wireless Digital Communications: Modulation and Spread Spectrum Applications" (1995), chapter 5, pp. 254–284.

Sherman, Ken, "Packet Switching", Data Communications (1990), chapter 17, pp. 384–407.

*Primary Examiner*—Vincent P. Canney
*Attorney, Agent, or Firm*—McDonnell Boehnen Hulbert & Berghoff

[57] ABSTRACT

A computationally simple yet powerful forward error correction code scheme for transmission of real-time media signals, such as digitized voice, video or audio, in a packet switched network, such as the Internet. The invention appends to each of a series of payload packets a single forward error correction code that is defined by taking the XOR sum of a preceding specified number of payload packets. The invention thereby enables correction from the loss of multiple packets in a row, without significantly increasing the data rate or otherwise delaying transmission.

24 Claims, 6 Drawing Sheets

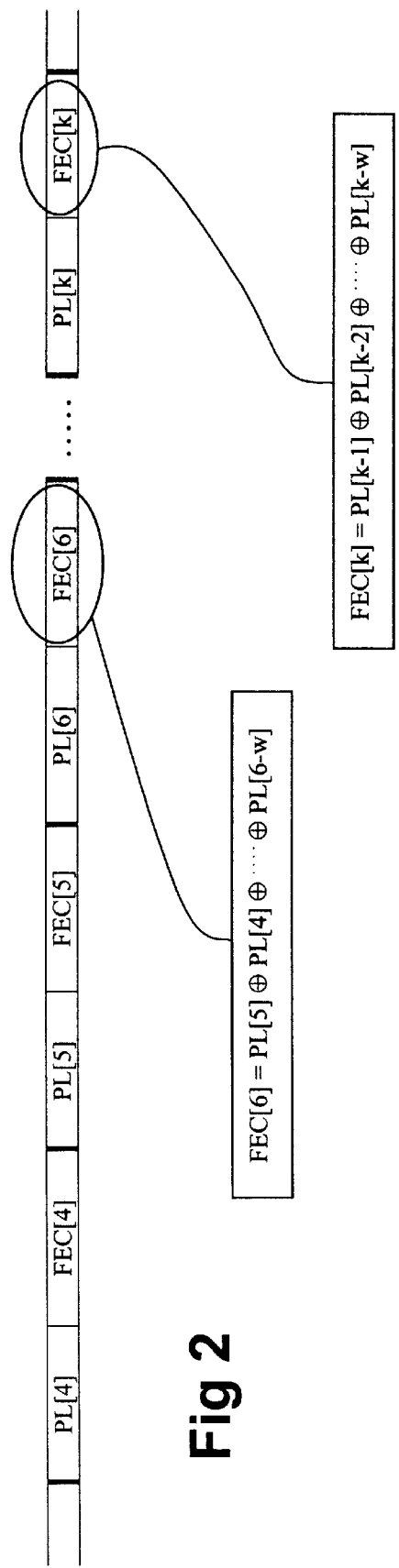

Fig. 7

Sequence of Windows of Analysis

| Step | Action | Window of Analysis |
|---|---|---|
| 1 | Recover lost data block 12 | 9 to 13 |
| 2 | Move window to bubbles 12-16 | 12 to 16 |
| 3 | No recovery | 11 to 15 |
| 4 | No recovery | 10 to 14 |
| 5 | No recovery | 9 to 13 |
| 6 | No recovery; Complete "inner loop" | 8 to 12 |
| 7 | No recovery | 7 to 11 |
| 8 | No recovery | 6 to 10 |
| 9 | No recovery; Complete "outer loop" | 5 to 9 |

5,870,412

FORWARD ERROR CORRECTION SYSTEM FOR PACKET BASED REAL TIME MEDIA

RELATED APPLICATIONS

This document is related to another U.S. patent application filed by the same inventors on the same date, also entitled "A Forward Error Correction System for Packet Based Real Time Media," the entirety of which is expressly incorporated herein by reference.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

The present invention relates to packet switched telecommunications networks and more particularly to a system for correcting loss of data packets in such a network.

In a packet switched network, a message to be sent is divided into blocks, or data packets, of fixed or variable length. The packets are then sent individually over the network through multiple locations and then reassembled at a final location before being delivered to a user at a receiving end. To ensure proper transmission and re-assembly of the blocks of data at the receiving end, various control data, such as sequence and verification information, is typically appended to each packet in the form of a packet header. At the receiving end, the packets are then reassembled and transmitted to an end user in a format compatible with the user's equipment.

A variety of packet switching protocols are available, and these protocols range in degree of efficiency and reliability. Those skilled in the art are familiar, for instance, with the TCP/IP suite of protocols, which is used to manage transmission of packets throughout the Internet. Two of the protocols within the TCP/IP suite, as examples, are TCP and UDP.

TCP is a reliable connection-oriented protocol, which includes intelligence necessary to confirm successful transmission between sending and receiving ends in the network. According to TCP, each packet is marked in its header with a sequence number to allow the receiving end to properly reassemble the packets into the original message. The receiving end is then typically configured to acknowledge receipt of packets and expressly request the sending end to re-transmit any lost packets. UDP, in contrast, is an unreliable connectionless protocol, which facilitates sending and receiving of packets but does not include any intelligence to establish that a packet successfully reached its destination.

In the Internet, loss of entire packets has been found to occur at a rate of over 20% when the network is very congested. Typically, this packet loss occurs one packet at a time. However, at times, multiple sequential packets in a row may be lost. In either case, as those skilled in the art will appreciate, a connection-oriented protocol such as TCP introduces delay into packet transmission, due to its need to confirm successful transmission and to request retransmission of these lost packets. While this delay may not be a significant problem in the transmission of pure data signals (such as an e-mail message), the delay can unacceptably disrupt the transmission of real-time media signals (such as digitized voice, video or audio). Therefore, a need exists for a improved system of responding to and correcting packet loss errors.

SUMMARY OF THE INVENTION

The present invention provides a computationally simple yet powerful system for handling packet loss that may arise in the communication of real time media signals, such as digitized voice, video or audio, in a packet switched network. The invention generates and appends to each of a series of payload packets a forward error correction code that is defined by taking the XOR sum of a predetermined number of preceding payload packets. In this way, a receiving end may extract lost payload from the redundant error correction codes carried by succeeding packets and may correct for the loss of multiple packets in a row.

Beneficially, regardless of the number of packets in a row to be recovered by this correction scheme, the size of the forward error correction code employed by the present invention is of the same order as the payload itself. The present invention does not increase the packet rate or introduce significant delay into the transmission process.

These as well as other advantages of the present invention will become apparent to those of ordinary skill in the art by reading the following detailed description, with appropriate reference to the accompanying drawings.

BRIEF DESCRIPTION OF THE DRAWINGS

A preferred embodiment of the present invention is described herein with reference to the drawings, in which:

FIG. 1 depicts a payload data stream divided into payload packets PL[k];

FIG. 2 depicts an output data stream coded in accordance with a preferred embodiment of the present invention, including packets of the form P[k]={PL[k], FEC[k]};

FIG. 7 lists the steps depicted in FIG. 6.

DETAILED DESCRIPTION OF THE PREFERRED EMBODIMENT

Figure 3:
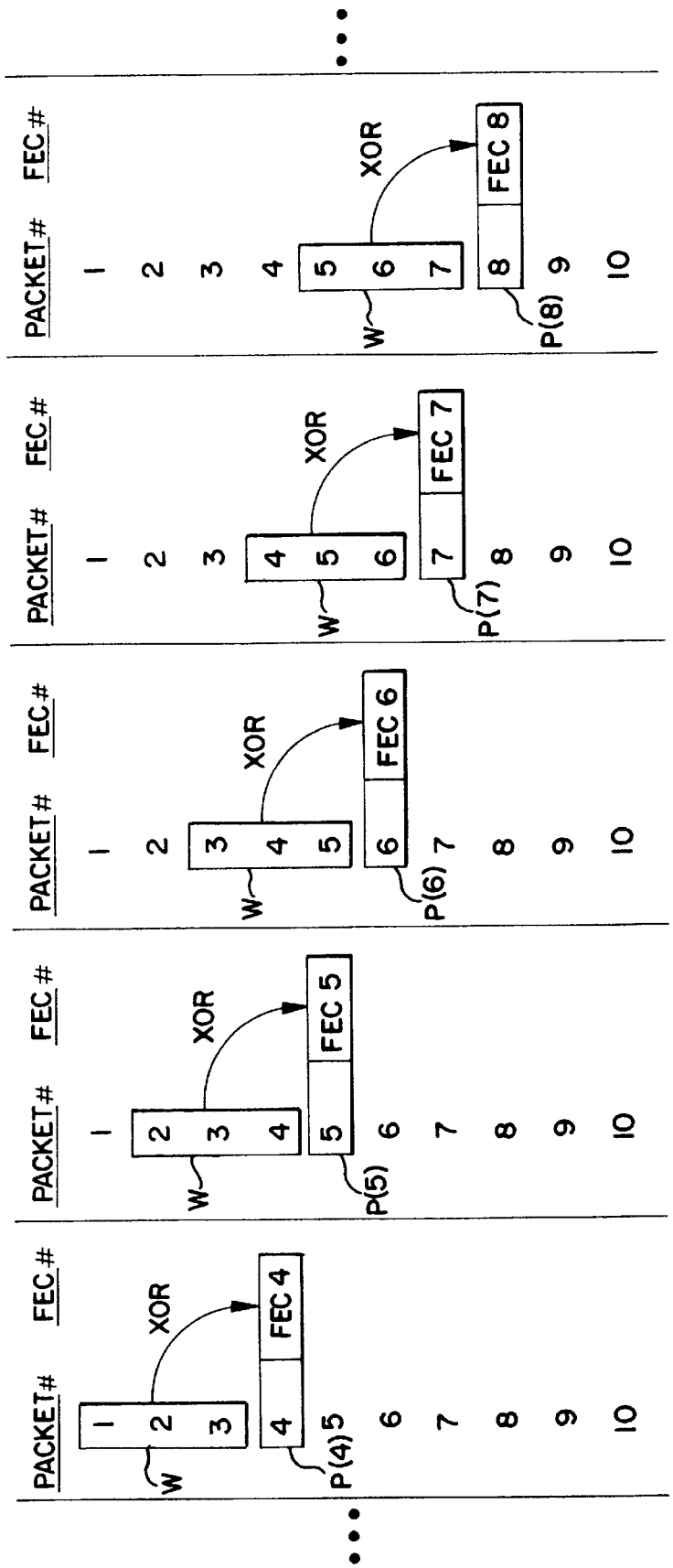
FIG. 3 depicts several stages of an encoder operating in a preferred embodiment of the present invention.

The present invention provides an improved system for communicating substantially real time media signals through an unreliable digital transmission channel. The invention may find particular use for transmission of digitized video or audio (including, for instance, voice) signals over the Internet. In the preferred embodiment, the invention employs a computationally simple error correction scheme that enables the recovery of lost data packets within specified limits, while beneficially adding very little delay in transmission time.

For purposes of illustration, the following description will assume that an audio or video signal has been converted into a digital data stream and is to be transmitted in a network from a first node to a second node. It will be appreciated, of course, that the invention is not restricted to use in a traditional network configuration but may extend to any communication path through which a sequence of packets are transmitted, including, for instance, a direct path. In the preferred embodiment, however, the signal at issue is to be transmitted between nodes of a network such as the Internet.

The description will further assume by way of example that the digital data stream, or payload, has been divided into a sequence of frames or payload packets, PL[1], PL[2], PL[3], PL[4], PL[5], PL[6], ..., PL[k]. A source data stream divided into these packets is illustrated for example in FIG. 1. In this example, each of these payload packets consists of a set number of bytes or bits and preferably represents a portion of a signal to be transmitted through a network.

This description additionally assumes that the packets will be transmitted in a network according to a packet switching protocol that employs a bit-wise or other high resolution verification scheme such as a checksum or parity bit. Therefore, it will be assumed that a technique is in place to respond to loss of some portion of a successfully transmitted packet. Remaining at issue, however, is how to correct for loss of one or more entire packets.

As discussed in the Background section above, the TCP protocol offers one method for responding to loss of packets in a digital transmission network. According to TCP, the receiving node may be configured to acknowledge receipt of packets and expressly request the transmitting node to retransmit any lost packets. This request and retransmission system is generally accurate. However, as noted above, the system is not well suited for use in the context of realtime media transmissions, because the transmission of such signals is very sensitive to the delay introduced by retransmission requests.

Rather than employing a request and retransmission system, greater efficiency in packet loss correction may be achieved by transmitting a correction code of some sort concurrently with the payload data, thereby providing the receiving end with sufficient information to recover lost packets. Several error correction code mechanisms are available for this purpose. These mechanisms include, for instance, interleaving and block coding.

Interleaving is commonly used in wireless communications, providing an effective method to combat error bursts that occur on a fading channel. Interleaving generally calls for spreading the bits of each codeword (or payload packet) apart from each other so they experience independent fading and so that the original data may be more readily recovered.

Block coding, in turn, calls for mapping a frame of binary source data into a coded block of data that includes a set of redundant parity symbols. By conventional terminology, a block coder typically converts a group of k payload units (such as bytes or bits) into a larger group of n units by appending p=n-k parity units or forward error correction (FEC) codes to the group. Each parity packet is generated through a predetermined coding technique based on all or some subset of the k payload units. One of the simplest forms of a block code is a repetition code, in which the binary source data is repeated as a set of parity bits. One of the more popular but complex block codes is the Reed-Solomon (RS) class of codes over the $2^8$ Galois field. These codes are optimal in their ability to correct erased bytes. For example, provided that 8 bytes are protected with 3 parity bytes (a total of 11 bytes), any three bytes can be lost, and the original 8 bytes may still be recovered.

Unfortunately, however, the addition of redundant parity packets gives rise to increased complexity and delays in transmission. In a packet switched network, routers route packets based on information contained in the packet headers. Therefore, the amount of work performed by a packet router generally relates directly to the number of packets being routed. Because each packet, whether payload or parity, contains its own header, an increase in packet rate consequently increases the burden on network routers and could delay transmission time or, in theory, cause a network to fail.

Adding separate parity packets to the transmission sequence is a particular waste of resources when done in the context of some of the more common real-time media transmission protocols, because many of the existing protocols add substantial overhead to each packet. For instance, the G.723.1 voice coder provides 24 bytes of payload every 30 milliseconds, but RTP/UDP/IP adds a 50 byte header to each payload packet. A parity block destined for the same receiving end as an adjacent payload block would have a header almost identical to the header of the payload block. Yet the parity packet would still require the full 44 bytes of overhead, resulting in a waste of bandwidth. As this example illustrates, traditional block coding techniques are therefore not well suited for correcting packet loss in real time media transmissions.

To avoid an increase in packet rate, another technique for providing parity information is to append redundant parity information to existing payload packets. For instance, as an offshoot of traditional repetition codes, the transmitting node may append to each payload packet redundant copies of the preceding n number of payload packets. In this way, the receiving end may readily recover a lost packet PL[k] from one of the n subsequent packets PL[k+1]...PL[k+n]. For instance, with n=2, payload packets PL[k-1] and PL[k-2] would be redundantly appended to and transmitted together with payload packet PL[k], providing the following transmission packets P[k], for example:

| | | | |
|---|---|---|---|
| P[1] = | { PL[1], | PL[0], | PL[-1]} |
| P[2] = | { PL[2], | PL[1], | PL[0] } |
| P[3] = | { PL[3], | PL[2], | PL[1] } |
| P[4] = | { PL[4], | PL[3], | PL[2] } |
| P[5] = | { PL[5], | PL[4], | PL[3] } |
| P[6] = | { PL[6], | PL[5], | PL[4] } |
| P[7] = | { PL[7], | PL[6], | PL[5] } |
| P[8] = | { PL[8], | PL[7], | PL[6] } |
| P[9] = | { PL[9], | PL[8], | PL[7] } |
| *** | | | |
| P[k] = | { PL[k], | PL[k-1], | PL[k-2]} |

With this scheme, in the event a payload packet is lost in transmission, the receiving end may simply extract a redundant copy of the payload from one of the n subsequent data packets.

By appending n preceding payload packets to each current data packet P[k], it becomes possible to recover n lost packets in a row without having to request retransmission. As more preceding packets are concatenated with each current packet, the network can tolerate a higher rate of packet loss. Additionally, this method will not affect the packet rate or routing rate, since, as noted above, the routing rate is concerned principally with the header information in a given packet, rather than with the size of each packet. Unfortunately, however, by concatenating multiple payload packets, this method necessarily and substantially increases the data rate. For instance, to be able to correct for two lost packets in a row (n=2) this method nearly triples the size of every packet. Therefore, this method is also not desirable.

Instead, the present invention beneficially provides a suitable and less costly scheme of correcting for packet loss, adding very little delay to transmission time. The invention preferably employs a coding technique in which parity bits associated with current packets are piggy-backed onto future packets. Rather than concatenating multiple previous payload packets with each current payload packet (and thus greatly raising the data rate), the preferred embodiment of the present invention calls for concatenating a single forward error correction (FEC) code (block code, or redundancy block) with each payload packet in a way that enables the recovery of multiple lost packets in a row.

According to a preferred embodiment of the present invention, the single FEC appended to each payload packet is about the same size as the payload packet and is computed by taking the XOR (exclusive-or, or ⊕) product of a predetermined number w of preceding payload packets, where w is preferably more than 1. In turn, at the receiving end, if a packet is lost, the associated payload may be extracted from the XOR sum carried by one or more subsequent data packets.

In general, the present invention therefore calls for building a forward error correction code FEC[k] for each payload packet P[k], where FEC[k]=PL[k−1]⊕PL[k−2]⊕, . . . , ⊕ PL[k−w], and where w is a positive integer generally greater than 1. This FEC[k] is then piggy-backed onto the payload PL[j], where j>k. The resulting packet P[k] is therefore the concatenation of the payload and the FEC: P[k]={PL[k], FEC[k]}. FIG. 2 illustrates a data stream containing a sequence of packets concatenated with their associated forward error correction codes in this fashion.

The predetermined number w defines a sliding window over which the XOR operation is taken and, as a result, defines the length of a burst error, or number of lost packets in a row, from which the system is able to recover. As a block coder that adds a single redundancy block to each data packet based on the previous w data packets, the present invention may be understood to employ (n, k) values of $k=w;$ and $n=k+1.$ Thus, for instance, if the sliding window w is 5, then the (n, k) values of the XOR block coder according to the present invention are (6, 5).

By repeatedly generating block codes according to a sliding window over a sequence of packets, the packet data is used in several block codes rather than in only a single block code. Consequently, the present invention provides a high order redundancy and enables the recovery of multiple lost packets in a row, while requiring only a single redundancy block per packet.

To better understand the operation of this sliding window, FIG. 3 depicts several stages of an encoder operating in a preferred embodiment of the invention. FIG. 3 assumes that 10 packets (numbered 1–10) are to be transmitted in a network and that the window size w is 3. In the first stage shown, the window w covers payload packets PL[1]–PL[3], so that the encoder computes FEC[4]=PL[1]⊕PL[2]⊕PL[3]. The encoder then appends this FEC[4] redundancy block to payload packet PL[4] and outputs the resulting packet P[4]={PL[4], FEC[4]} for transmission to the receiving end. In turn, in the next stage shown, the window w covers payload packets P[2]–P[4], so that the encoder computes FEC[5]=PL[2]⊕PL[3]⊕PL[4]. The encoder then appends this FEC[5] redundancy block to payload packet PL[5] and outputs the resulting packet P[5]={PL[5], FEC[5]} for transmission to the receiving end. As partially illustrated in the figure, this process continues as long as the sequence of payload packets continues.

The use of the XOR operation presumes that the packets being combined are of the same length (for instance, the same number of bits). The present invention, however, will work equally well in a network of variable length packets. Provided with packets of various lengths, the invention contemplates padding the shorter packets with zeros, so that all packets combined in a single XOR operation, as well as the resulting XOR sum, will be the length of the longest among them. Once the XOR coding operation is complete, the extra zeros are dropped from each padded packet, and the unpadded packet is output for transmission to the network (together with a redundancy block based on the previous w packets). In this variation, extra codes may be added to the header to indicate the lengths of the data block and the redundancy block, in order to facilitate decoding in accordance with the invention.

It should be further appreciated, of course, that the FEC contemplated by the present invention is not restricted to being equal to the above-described XOR sum, but may include other modifications as necessary. For instance, the present invention would extend to the use of an FEC that is computed by taking an XOR sum of the previous w payload packets and then inverting one or more predetermined digits or cyclically shifting the code or resulting packet. Additionally, it will be understood that the above equation is set forth for purposes of illustration only and that the present invention is not necessarily limited to employing the XOR sum of 3 or more (k−1, k−2, . . . , k−w) preceding payload packets; the invention may, for instance, extend to the XOR sum of only the previous two payload packets as well. Still further, it will be appreciated that the sequence illustrated in FIG. 1 is shown for example only; the present invention may equally extend to separate and independent transmission of packets P[k]={PL[k], FEC[k]} through a packet switched network.

As a general example of the encoding and decoding process contemplated by the present invention, the following illustrates the structure of a series of payload packets P[k] generated by an encoder, given payload frame PF[k] and a window w =3:

```
P[1] = { PL[1],FEC[1]} = { PL[1],   PL[0] ⊕ PL[−1] ⊕ PL[−2]   }
P[2] = { PL[2],FEC[2]} = { PL[2],   PL[1] ⊕ PL[0] ⊕ PL[−1]    }
P[3] = { PL[3],FEC[3]} = { PL[3],   PL[2] ⊕ PL[1] ⊕ PL[0]     }
P[4] = { PL[4],FEC[4]} = { PL[4],   PL[3] ⊕ PL[2] ⊕ PL[1]     }
P[5] = { PL[5],FEC[5]} = { PL[5],   PL[4] ⊕ PL[3] ⊕ PL[2]     }
P[6] = { PL[6],FEC[6]} = { PL[6],   PL[5] ⊕ PL[4] ⊕ PL[3]     }
P[7] = { PL[7],FEC[7]} = { PL[7],   PL[6] ⊕ PL[5] ⊕ PL[4]     }
P[8] = { PL[8],FEC[8]} = { PL[8],   PL[7] ⊕ PL[6] ⊕ PL[5]     }
P[9] = { PL[9],FEC[9]} = { PL[9],   PL[8] ⊕ PL[7] ⊕ PL[6]     }
***
P[k] = { PL[k],FEC[k]} = { PL[k],   PL[k−1] ⊕ PL[k−2] ⊕ PL[k−3]   }
```

Assume that packet P[5] was lost in transmission. With the present invention, a decoder may recreate packet P[5] by using the FEC of the packets in which packet P[5] was included. In this case, since w=3, the three packets following packet P[5] are each based in part on the value of payload packet PL[5]. Consequently, payload packet PL[5] may be recovered by solving any of the equations defining these three packets. For instance, using packet P[8], FEC[8]=PL[7]⊕PL[6]⊕PL[5], and PL[5]=FEC[8]⊕PL[7]⊕PL[6].

This example may be extended to illustrate that, provided with a window w=3, the present invention enables the recovery of three packets lost in a row. Assume, for instance, that packets P[4], P[5] and P[6] are lost. In order to recover the payload carried by these lost packets, the subsequent three packets, P[7], P[8] and P[9], will need to have arrived successfully. Provided with these three packets, the receiving end may first extract payload packet PL[6] from FEC[9] as follows:

FEC[9]=PL[8]⊕PL[7]⊕PL[6],
and PL[6]=FEC[9]⊕PL[8]⊕PL[7].

Next, the receiving end may extract payload packet PL[5] from FEC[8] as follows:

FEC[8]=PL[7]⊕PL[6]⊕PL[5], and PL[5]=FEC[8]⊕PL[7]⊕PL[6].

Finally, the receiving end may extract payload packet PL[4] from FEC[7] as follows:

FEC[7]=PL[6]⊕PL[5]⊕PL[4],
and PL[4]=FEC[7]⊕PL[6]⊕PL[5].

The foregoing illustrates a straightforward mechanism for recovering lost data within the present invention. This mechanism works well when the transmitted packets arrive in sequence, as would occur with the transmission of ATM cells. With packets arriving in sequence, a lost packet can be recovered as soon as the next w packets successfully arrive. In many transmission systems, however, sequentially numbered packets that are sent in order through a network do not arrive at the receiving end in their original sequence.

Figure 4:
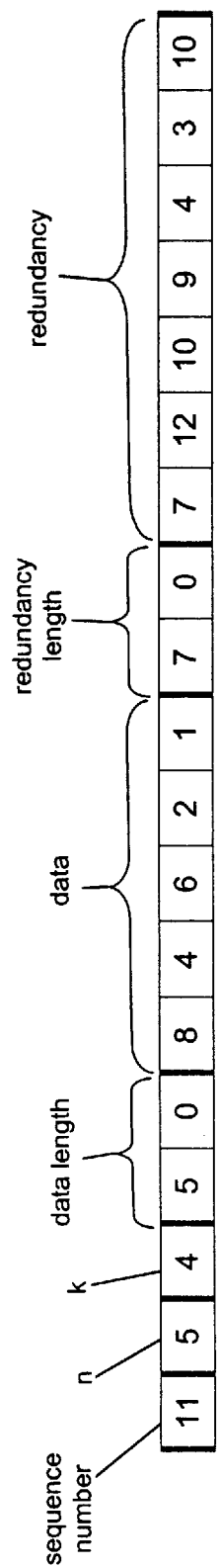
FIG. 4 depicts a packet encoded in accordance with a preferred embodiment of the present invention.

To enable more robust recovery of lost packets, a preferred embodiment of the invention preferably operates as follows. At the sending end, an encoder translates incoming data into packets, using the XOR encoding mechanism of the present invention. As described above, this XOR encoder employs a sliding window w, such that the n and k values of the block coder are (n=k+1, k=w). Each packet preferably includes an indication of the sequence number (packet number), the (n, k) values, a payload/data block and a redundancy block. Additionally, to account for possible variation in packet length, each packet also preferably includes an indication of data length and an indication of redundancy length. FIG. 4 illustrates an example of a packet containing this information, where the encoder employs a sliding window w of 4 (and, therefore, k=4).

At the receiving end, a decoder is in place to receive these packets and recover any lost packets that can be recovered. According to the preferred embodiment of the invention, as the decoder receives a packet, it stores the packet in memory, parses the packet into its components, and creates a "bubble" of information (for instance, a "c"-structure), containing the sequence number, and pointers to the data block and the redundancy block in the packet. The decoder then places the bubble into a doubly linked list by storing a pointer to the bubble. Additionally, the decoder preferably passes the data block downstream for use by other elements in the transmission system.

Figure 5:
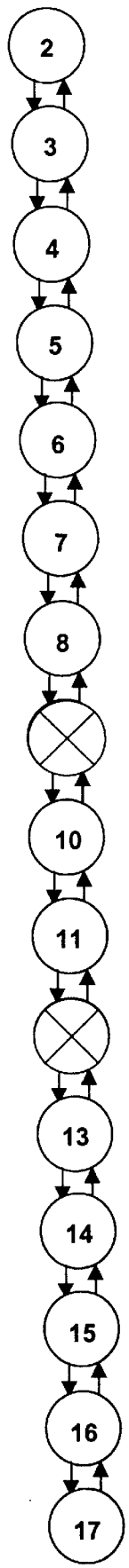
FIG. 5 depicts a link list compiled by a decoder operating in accordance with a preferred embodiment of the present invention.
Figure 6:
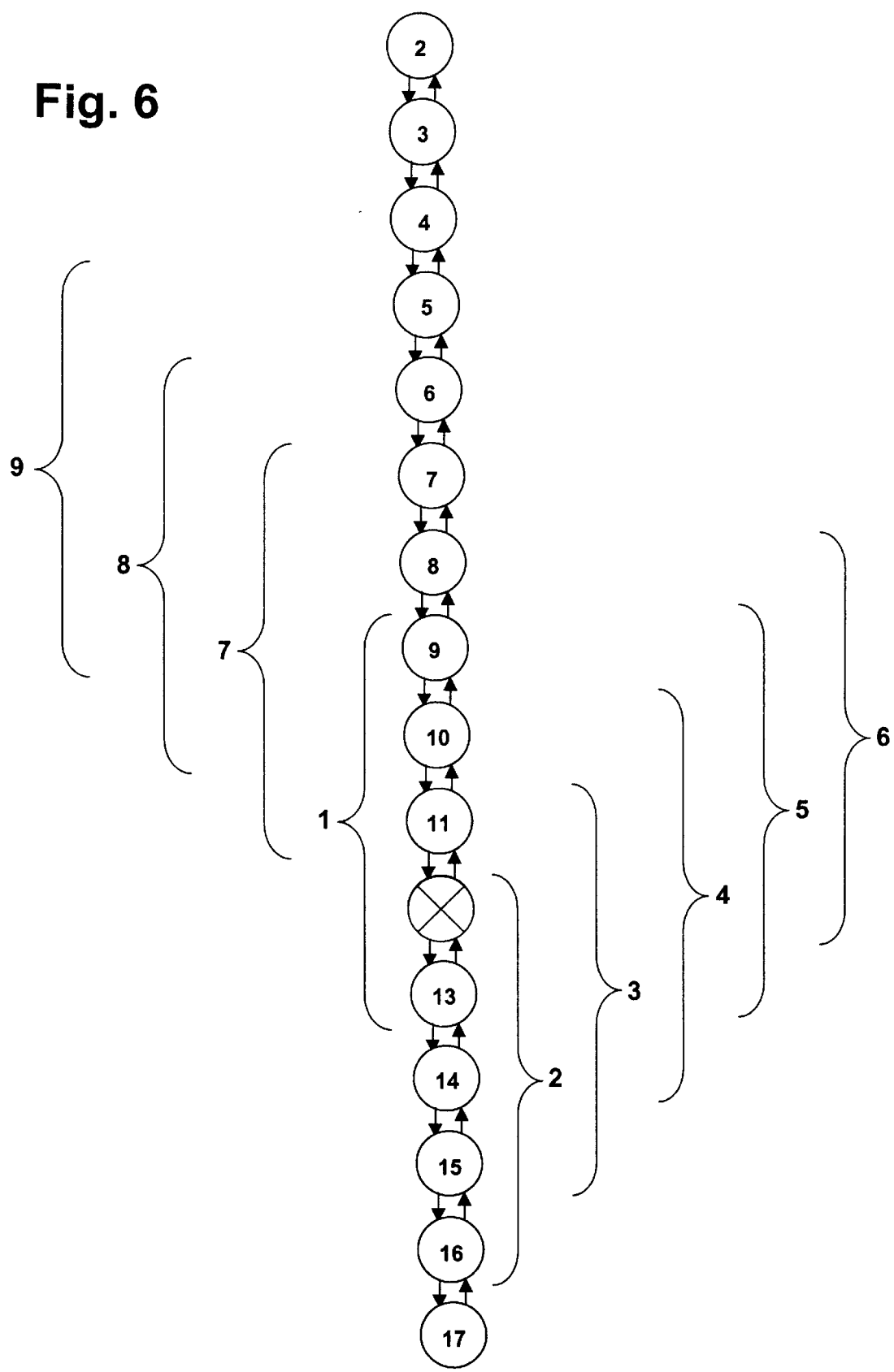
FIG. 6 depicts the analysis steps performed by a decoder operating in accordance with a preferred embodiment of the present invention.

In the preferred embodiment, each time the decoder receives new information and adds a bubble to the link list, it determines whether the information in the bubble can help to recover any missing information. For example, FIG. 5 illustrates a series of bubbles 2–17 compiled by a sample decoder. As shown by FIG. 5, assume that bubbles 9 and 12 are missing, but the decoder has so far received packets sufficient to provide the information needed for bubbles 2–8, 10–11 and 13–17. Assume now that packet 9 arrives. The decoder receives packet 9 and inserts bubble 9 in the link list, to obtain a revised link list shown in FIG. 6.

Because the sliding window w in this example is 4 (as established by the value of k included in each received packet), the decoder knows that, in an ordered sequence of packets, each packet is related through an XOR operation with the preceding 4 packets as well as with the following 4 packets. In the present example, therefore, the decoder knows that the information newly received from packet number 9 can help to recover lost data, if any, in bubbles 5–8 and 10–13. This range may be referred to as the relevant range with respect to newly received packet number 9. Knowing this relevant range conveniently limits the work that the decoder needs to do when it receives a new packet in order to decide whether the information can help in some way.

In the preferred embodiment, the decoder analyzes the relevant range (5–13 in this example) as follows. The decoder begins at the end of the range by considering bubbles 9–13, which may be referred to as a window of analysis. In this window of analysis, the decoder first determines whether there is exactly one data block missing in the range 9–12 that the redundancy block 13, which needs to be in the linked list, can help recover (through the XOR operation). If more than one data block is missing in the range 9–12, the decoder knows that it cannot, with the XOR operation, recover any data in the window of analysis. In that case, or in the event the decoder finds no missing data in the window of analysis, then the decoder moves the window of analysis up one notch and repeats this analysis, now for the window of analysis defined by bubbles 8–12. The decoder continues this process until it completes its analysis with the top of the window of analysis at the top of the relevant range, which is bubble 5 in this example.

If the decoder determines that exactly one data block is missing in a given window of analysis, and the last bubble in the analysis window contains a redundancy block, then the decoder may employ the XOR operation as discussed above to recover the missing data block. Once it does so, it will have received a new piece of information, namely, the recovered data block, which should give rise to a new relevant range. As a result, the decoder may jump back to a higher number bubble (i.e., down in the link list), moving the window of analysis to a higher number starting point. The decoder may then continue moving the window of analysis up the link list until the top of the window of analysis has reached the top of the original relevant range.

In this example, for instance, once the window of analysis is over bubbles 9-13, the missing data block 12 can be recovered by taking the XOR sum of data blocks 9, 10 and 11 and redundancy block 13. The decoder will therefore have the newly received information of data block 12, which gives rise to a new relevant range of 8–16 (i.e., 8–12 and 12–16). As a result, the decoder positions a new window of analysis to start over bubbles 12–16 and to move upward bubble-by-bubble as discussed above. For instance, if packet 15 had not yet arrived, but data blocks 12, 13 and 14 and redundancy block 16 had arrived, then the decoder could compute data block 15 using the XOR operation.

It will be appreciated that two window of analysis loops are thus in operation. A first window of analysis loop, or "outer loop," is operating as a result of the receipt of data block 9. A second window of analysis loop, or "inner loop," is operating as a result of the recovery of data block 12. The outer loop is geared to move a window of analysis up the link list until the decoder has completed its analysis of bubbles 5–9. The inner loop, in comparison, is geared to move a window of analysis up the link list until the decoder has completed its analysis of bubbles 8–12.

In order to avoid unnecessary repetition, a decoder operating according to the preferred embodiment of the present invention will complete the inner loop and will then continue moving up the link list to complete the outer loop, without jumping back to where it left off before it began the inner loop. Thus, in the above example, the steps performed by the decoder are illustrated by the brackets in FIG. 6 and by the rows in FIG. 7. As shown in these Figures, at step 1, the decoder first analyzes bubbles 9–13 and recovers lost data block 12. At step 2, the decoder therefore jumps to a window of analysis over bubbles 12–16, where the decoder recovers no new data. At steps 3 through 6, the decoder moves the window of analysis bubble-by-bubble up the link list, until it has completed the inner loop at bubbles 8–12, recovering no new data at each step.

Next, rather than recursively returning to the outer loop and repeating an analysis of bubbles 8–12, the decoder continues moving up the link list from where it left off with the inner loop, analyzing bubbles 7–11 at step 7, bubbles 6–10 at step 8, and bubbles 5–9 at step 9. In this example, the decoder does not recover any additional data along the way. After completing its analysis of bubbles 5–9, the decoder's analysis is complete, and the decoder waits for the arrival of a new packet to begin another analysis.

While an encoder or decoder operating in accordance with the present invention may take any of a variety of forms (such as hardware, software or firmware), both the encoding and decoding functions are preferably carried out by a computer processor or microprocessor operating a set of machine language instructions that are stored in a memory. As an example, the following is a C++ source code listing, which can be compiled by any standard C++ compiler and executed by an appropriate processor.

```
/* CODER.C */
/***************************************************************************/
/*                                                                         */
/* coder.c                                                                 */
/*                                                                         */
/* 10/7/97                                                                 */
/*                                                                         */
/* Guido Schuster                                                          */
/* Advanced Technologies                                                   */
/* Carrier Systems Division                                                */
/* 3COM                                                                    */
/* 1800 W. Central Rd.                                                     */
/* Mount Prospect, Il 60056                                                */
/*                                                                         */
/* This is a test program for the forward error correction modules. Twenty packets of */
/* variable length are created. These packets are then put into the channel coder. Then */
/* some of the output packets of the channel coder are dropped and/or rearranged. This */
/* results in a packet stream with out of order packets and lost packets. This stream is */
/* then fed into the channel decoder which attempts to recover the dropped packets. Finally */
/* the resulting packet stream is displayed                                */
/***************************************************************************/

/******************************* The Include Files ********************************/
#include "stdlib.h"   // the basic libraries
#include "malloc.h"
include "string.h"
include "windows.h"

#include "types.h"     // this is where the general types are defined
#include "RTOS.h"      // the real time operating system (rtos),
                       // basically the messageboxes include "rs_coder.h"      // the reed solomon channel coder
include "rs_decoder.h"    // the reed solomon channel decoder
#include "xor_coder.h"     // the XOR based channel coder
#include "xor_decoder.h"   // the XOR based channel decoder
/**********************************************************************************/

/*********************** The Define Statements *********************************/
#define RS     0    // the reed solomon coder is used instead of the XOR coder
#define N_RS   6    // the block length for the FEC (forward error correction)
#define K_RS   4    // the number of information bytes
```

```
define MEM_RS    10000   // the target number of bytes used for storing the packets define XOR        1      // the XOR coder is used instead of the RS coder
define N_XOR      6      // the block length for the XOR
#define MEM_XOR    10000  // the target number of bytes used for storing the packets
/*******************************************************************************/

/******************************* The Main Program *****************************/
/* No Inputs, the only output is what is printed to the screen, which is the packet stream */
/* exiting the decoder                                                         */
void main (void )
{
    PKT *pCoderInPacket[20];   // used to store the packets
    PKT *pCoderOutPacket[20];
    PKT *pDeCoderInPacket[20];
    PKT *pDeCoderOutPacket[20];

MESSAGEBOX *pCoderInBox    = CreateEmptyMessageBox();  // used to pass the packets
    MESSAGEBOX *pCoderOutBox   = CreateEmptyMessageBox();
    MESSAGEBOX *pDeCoderInBox  = CreateEmptyMessageBox();
    MESSAGEBOX *pDeCoderOutBox = CreateEmptyMessageBox();

// init the coder and the decoder
    if (XOR)
    {
        init_xor_coder(N_XOR);
        init_xor_decoder(N_XOR,MEM_XOR);
    }
    if (RS)
    {
        init_rs_coder(N_RS,K_RS);
        init_rs_decoder(N_RS,K_RS,MEM_RS);
    }
    // Initialize the test packets
    for(int i=0;i<20;i++)
    {
        pCoderInPacket[i] = new PKT;
        pCoderInPacket[i]->nLengthBytes=i;
        pCoderInPacket[i]->pData=malloc(pCoderInPacket[i]->nLengthBytes);
        for (int j=0;j<pCoderInPacket[i]->nLengthBytes;j++)
            *(((unsigned char*)pCoderInPacket[i]->pData)+j)='0'+i%10;
```

```
// Send the test packets into the coder and run the coder
for(i=0;i<20;i++)
{
    AddMessageToBox(pCoderInBox,(void*)pCoderInPacket[i]);
    if(XOR)
    {
        xor_coder(pCoderInBox,pCoderOutBox);
    }
    if(RS)
    {
        rs_coder(pCoderInBox,pCoderOutBox);
    }
}

// Simulate the Internet, i.e., packets can be lost or arrive out of sequence
// first read the packets
for(i=0;i<20;i++)
{
    pCoderOutPacket[i]=(PKT*)GetMessageFromBox(pCoderOutBox);
}

// drop some packets
for (i=0;i<20;i++)
{
    if (i==1||i==7||i==13||i==14)
    {
        pCoderOutPacket[i]=NULL;
    }
}

// change the sequence
int from[20]={0,1,2,3,4,5,6,7,8,9,10,11,12,13,14,15,16,17,18,19};
int to[20]  ={1,2,0,3,4,5,9,6,7,8,10,11,12,13,14,18,15,16,17,19};
for(i=0;i<20;i++)
{
    pDeCoderInPacket[to[i]]=pCoderOutPacket[from[i]];
}

// pass the packets to the decoder
for(i=0;i<20;i++)
{
    if(pDeCoderInPacket[i])
```

```
        AddMessageToBox(pDeCoderInBox,pDeCoderInPacket[i]);
        // run the decoder
        if(RS)
        {
            rs_decoder(pDeCoderInBox,pDeCoderOutBox);
        }
        if(XOR)
        {
            xor_decoder(pDeCoderInBox,pDeCoderOutBox);
        }
    }
    // display the result
    for(i=0;i<20;i++)
    {
        while(pDeCoderOutPacket[i]=(PKT*)GetMessageFromBox(pDeCoderOutBox))
        {
            PrintPacket(pDeCoderOutPacket[i]);
        }
    }
}
/****************************************************************************/

/* DLLIST.C */
#include <stdio.h>
include <stdlib.h>
#include "dllist.h"

static int nNextDLLId = 0;

/****************************************************************************/
/**                                                                       **/
/** Call this function to create a doubly linked list and to get a        **/
/** pointer to the list. This pointer is needed to do all operations      **/
/** on the list.                                                          **/
/**                                                                       **/
/** When a list is done being used (such as at the end of the             **/
/** program), call DLLDestroy() with this pointer.                        **/
/**                                                                       **/
/** Returns:   pointer to the linked list structure.                      **/
```

```
/**
/*****************************************************************************/
DLLType* DLLCreate()
{
    DLLType* pDLL;

/* generate a new ID for the list */
    nNextDllId++;

pDLL = (DLLType*)malloc(sizeof(DLLType));
    if( pDLL == NULL )
    {
        /* error -- not enough memory */
        return (NULL);
    }

/* fill in fields in DLL structure */
    pDLL->pHead    = NULL;
    pDLL->pTail    = NULL;
    pDLL->ulCount  = 0;
    pDLL->nID      = nNextDllId;
    pDLL->pPtr     = NULL;
    return (pDLL);
}

/*****************************************************************************/
/**                                                                         **/
/**  Call this function to destroy a doubly linked list that was            **/
/**  created with the DLLCreate() function.  The pointer obtained from      **/
/**  DLLCreate() must be supplied to this function.                         **/
/**                                                                         **/
/**  Note that only the nodes of the linked list and the data               **/
/**  structure holding information about the linked list is destroyed.      **/
/**  If any nodes are in the list when this function is called, the         **/
/**  data pointed to by the nodes is NOT cleared.  The clearing of          **/
/**  that data is the responsibility of the program that allocated          **/
/**  that memory.                                                           **/
/**                                                                         **/
/*****************************************************************************/
void DLLDestroy( DLLType* pDLL )
{
    DLLNodeType* pDLLNode;
    DLLNodeType* pDLLNextNode;

if( DLLVerifyIntegrity(pDLL) )
```

```c
        /* DLL integrity not violated. */
        /* Erase all nodes */
        pDLLNode = pDLL->pHead;
        while( pDLLNode )
        {
            pDLLNextNode = pDLLNode->pNextNode;
            free( pDLLNode );
            pDLLNode = pDLLNextNode;
        }
    }
    free( pDLL );
}

/****************************************************************/
/**                                                            **/
/** Call this function to insert a node into the linked list at the **/
/** head of the list.  This node will point to the data stored at **/
/** pData.                                                     **/
/**                                                            **/
/** Returns:  0 if operation failed (out of memory)            **/
/**           1 if operation successful                        **/
/**                                                            **/
/****************************************************************/
int DLLInsertAtHead( DLLType* pDLL, void* pData )
{
    DLLNodeType* pDLLNode;

pDLLNode = (DLLNodeType*)malloc(sizeof(DLLNodeType));
    if( pDLLNode == NULL )
    {
        /* error -- not enough memory */
        return (0);
    }

/* update all pointers */
    if( pDLL->pHead == NULL )
    {
        /* list empty */
        pDLL->pHead = pDLLNode;
        pDLL->pTail = pDLLNode;
        pDLLNode->pNextNode = NULL;
        pDLLNode->pPrevNode = NULL;
    }
```

```c
    else
    {
        /* list not empty */
        pDLL->pHead->pPrevNode = pDLLNode;
        pDLLNode->pNextNode = pDLL->pHead;
        pDLLNode->pPrevNode = NULL;
        pDLL->pHead = pDLLNode;
    }

/* change pointer to data */
    pDLLNode->pData = pData;

/* update counter information */
    pDLL->ulCount++;

return (1);
}

/*************************************************************/
/**                                                         **/
/** Call this function to insert a node into the linked list at the **/
/** tail of the list.  This node will point to the data stored at **/
/** pData.                                                  **/
/**                                                         **/
/** Returns:   0 if operation failed (out of memory)        **/
/**            1 if operation successful                    **/
/**                                                         **/
/*************************************************************/
int DLLInsertAtTail( DLLType* pDLL, void* pData )
{
    DLLNodeType* pDLLNode;

pDLLNode = (DLLNodeType*)malloc(sizeof(DLLNodeType));
    if( pDLLNode == NULL )
    {
        /* error -- not enough memory */
        return (0);
    }

/* update all pointers */
    if( pDLL->pTail == NULL )
    {
        /* list empty */
        pDLL->pTail = pDLLNode;
```

```c
        pDLL->pHead = pDLLNode;
        pDLLNode->pNextNode = NULL;
        pDLLNode->pPrevNode = NULL;
    }
    else
    {
        /* list not empty */
        pDLL->pTail->pNextNode = pDLLNode;
        pDLLNode->pPrevNode = pDLL->pTail;
        pDLLNode->pNextNode = NULL;
        pDLL->pTail = pDLLNode;
    }

/* change pointer to data */
    pDLLNode->pData = pData;

/* update counter information */
    pDLL->ulCount++;

return (1);
}

/*******************************************************************/
/**                                                               **/
/** Call this function to remove a node from the linked list at the **/
/** head of the list. A pointer to the data pointed to by that node **/
/** is returned.                                                  **/
/**                                                               **/
/** Returns: NULL          if operation failed (list empty)       **/
/**          pointer to data if operation successful              **/
/**                                                               **/
/*******************************************************************/
void* DLLRemoveFromHead( DLLType* pDLL )
{
    void* pData;
    DLLNodeType* pNewHead;

/* check for empty list */
    if( pDLL->pHead == NULL )
    {
        /* list empty */
        return (NULL);
    }
```

```
/* remember where data is */
pData = pDLL->pHead->pData;

/* check for future validity of DLL Pointer */
if( pDLL->pPtr == pDLL->pHead )
{
    /* DLL Pointer points to head node    */
    /* DLL Pointer becomes invalid now    */
    pDLL->pPtr = NULL;
}

/* update all pointers */
if( pDLL->pHead == pDLL->pTail )
{
    /* only one element in list */
    free( pDLL->pHead );
    pDLL->pHead = NULL;
    pDLL->pTail = NULL;
}
else
{
    /* not the only element in list */
    pNewHead = pDLL->pHead->pNextNode;
    pNewHead->pPrevNode = NULL;
    free( pDLL->pHead );
    pDLL->pHead = pNewHead;
}

/* update counter information */
pDLL->ulCount--;

return (pData);
}

/******************************************************************/
/**                                                              **/
/** Call this function to remove a node from the linked list at the **/
/** tail of the list.  A pointer to the data pointed to by that node **/
/** is returned.                                                 **/
/**                                                              **/
/** Returns:  NULL            if operation failed (list empty)   **/
/**           pointer to data if operation successful            **/
/**                                                              **/
/******************************************************************/
```

```
void* DLLRemoveFromTail( DLLType* pDLL )
{
    void* pData;
    DLLNodeType* pNewTail;

/* check for empty list */
    if( pDLL->pTail == NULL )
    {
        /* list empty   */
        return (NULL);
    }

/* remember where data is */
    pData = pDLL->pTail->pData;

/* check for future validity of DLL Pointer */
    if( pDLL->pPtr == pDLL->pTail )
    {
        /* DLL Pointer points to head node  */
        /* DLL Pointer becomes invalid now  */
        pDLL->pPtr = NULL;
    }

/* update all pointers */
    if( pDLL->pHead == pDLL->pTail )
    {
        /* only one element in list */
        free( pDLL->pTail );
        pDLL->pHead = NULL;
        pDLL->pTail = NULL;
    }
    else
    {
        /* not the only element in list */
        pNewTail = pDLL->pTail->pPrevNode;
        pNewTail->pNextNode = NULL;
        free( pDLL->pTail );
        pDLL->pTail = pNewTail;
    }

/* update counter information */
    pDLL->ulCount--;

return (pData);
```

```
/***********************************************************/
/**                                                       **/
/** Call this function to remove a node from the linked list at the
/** specified node.                                       **/
/**                                                       **/
/** Returns:  NULL         if operation failed (list empty)
/**           pointer to data if operation successful     **/
/**                                                       **/
/***********************************************************/
void* DLLRemove( DLLType* pDLL, DLLNodeType* pDLLNode )
{
    void* pData;

if( pDLLNode == NULL )
    {
        /* error -- supplied pointer invalid */
        return (NULL);
    } if( pDLLNode == pDLL->pHead )
    {
        /* removing from head */
        return (DLLRemoveFromHead(pDLL));
    } if( pDLLNode == pDLL->pTail )
    {
        /* removing from tail */
        return (DLLRemoveFromTail(pDLL));
    }

/* removing one in middle */
    if( pDLLNode == pDLL->pPtr )
    {
        /* remove node pointed to by DLL Pointer */
        /* this will invalidate that pointer     */
        pDLL->pPtr = NULL;
    } if( pDLLNode->pPrevNode == NULL )
    {
        /* error -- supplied pointer not */
        /* part of this DLL              */
```

```
        return (NULL);
    } if( pDLLNode->pNextNode == NULL )
    {
        /* error -- supplied pointer not    */
        /* part of this DLL                 */
        return (NULL);
    } pDLLNode->pPrevNode->pNextNode = pDLLNode->pNextNode;
    pDLLNode->pNextNode->pPrevNode = pDLLNode->pPrevNode;

/* remember where data is */
    pData = pDLLNode->pData;

/* free node */
    free( pDLLNode );

/* update counter information */
    pDLL->ulCount--;

return (pData);
}

/**********************************************************************/
/**                                                                  **/
/**  Call this function to peek at the head node in the linked list. **/
/**  The node is not removed from the list, the pointer to the data  **/
/**  is simply returned.                                             **/
/**                                                                  **/
/**  Returns:   NULL        if operation failed (list empty)         **/
/**             pointer to data if operation successful              **/
/**                                                                  **/
/**********************************************************************/
void* DLLPeekAtHead( DLLType* pDLL )
{
    return( DLLPeek(pDLL, pDLL->pHead) );
}

/**********************************************************************/
/**                                                                  **/
/**  Call this function to peek at the tail node in the linked list. **/
/**  The node is not removed from the list, the pointer to the data  **/
/**  is simply returned.                                             **/
```

- 31 -

```c
/******************************************************************/
/**                                                              **/
/** Returns:  NULL           if operation failed (list empty)    **/
/**           pointer to data if operation successful            **/
/**                                                              **/
/******************************************************************/
void* DLLPeekAtTail( DLLType* pDLL )
{
    return( DLLPeek(pDLL, pDLL->pTail) );
}

/******************************************************************/
/**                                                              **/
/** Call this function to peek at the specified node in the linked **/
/** list. The node is not removed from the list, the pointer to the **/
/** data is simply returned.                                     **/
/**                                                              **/
/** Returns:  NULL           if operation failed (list empty)    **/
/**           pointer to data if operation successful            **/
/**                                                              **/
/******************************************************************/
void* DLLPeek( DLLType* pDLL, DLLNodeType* pDLLNode )
{
    /* prevent compiler complaining */
    pDLL->ulCount += 0;

if( pDLLNode == NULL )
    {
        /* error -- supplied pointer invalid */
        return (NULL);
    } return (pDLLNode->pData);
}

/******************************************************************/
/**                                                              **/
/** Call this function to insert a node pointing to the specified **/
/** data before the specified node in the list.                  **/
/**                                                              **/
/** Returns:  0 if operation failed (out of memory, etc)         **/
/**           1 if operation successful                          **/
/**                                                              **/
/******************************************************************/
int DLLInsertBefore( DLLType* pDLL, DLLNodeType* pDLLNode, void* pData )
{
```

```c
    DLLNodeType* pDLLNewNode;

if( pDLLNode == NULL )
    {
        /* means put at end */
        return (DLLInsertAtTail(pDLL,pData));
    } if( pDLL->pHead == pDLLNode )
    {
        /* inserting at beginning */
        return (DLLInsertAtHead(pDLL,pData));
    } if( pDLLNode->pPrevNode == NULL )
    {
        /* error -- supplied pointer is not  */
        /* head of list, but previous node   */
        /* is NULL -- perhaps node not part  */
        /* of this linked list               */
        return (0);
    } pDLLNewNode = (DLLNodeType*)malloc(sizeof(DLLNodeType));
    if( pDLLNewNode == NULL )
    {
        /* error -- not enough memory */
        return (0);
    }

/* inserting in middle */
    pDLLNewNode->pNextNode = pDLLNode;
    pDLLNewNode->pPrevNode = pDLLNode->pPrevNode;
    pDLLNewNode->pPrevNode->pNextNode = pDLLNewNode;
    pDLLNewNode->pNextNode->pPrevNode = pDLLNewNode;

/* change pointer to data */
    pDLLNewNode->pData = pData;

/* update counter information */
    pDLL->ulCount++;

return (1);
}
```

```
/*******************************************************/
/**                                                   **/
/** Call this function to insert a node pointing to the specified **/
/** data after the specified node in the list.        **/
/**                                                   **/
/** Returns:  0 if operation failed (out of memory, etc) **/
/**           1 if operation successful               **/
/**                                                   **/
/*******************************************************/
int DLLInsertAfter( DLLType* pDLL, DLLNodeType* pDLLNode, void* pData )
{
    DLLNodeType* pDLLNewNode;

if( pDLLNode == NULL )
    {
        /* means put at beginning */
        return (DLLInsertAtHead(pDLL,pData));
    } if( pDLL->pTail == pDLLNode )
    {
        /* inserting at end */
        return (DLLInsertAtTail(pDLL,pData));
    } if( pDLLNode->pNextNode == NULL )
    {
        /* error -- supplied pointer is not   */
        /* tail of list, but next node is     */
        /* NULL -- perhaps node not part of   */
        /* this linked list                   */
        return (0);
    } pDLLNewNode = (DLLNodeType*)malloc(sizeof(DLLNodeType));
    if( pDLLNewNode == NULL )
    {
        /* error -- not enough memory */
        return (0);
    }

/* inserting in middle */
    pDLLNewNode->pPrevNode = pDLLNode;
    pDLLNewNode->pNextNode = pDLLNode->pNextNode;
    pDLLNode->pNextNode->pPrevNode = pDLLNewNode;
    pDLLNode->pNextNode = pDLLNewNode;
```

```c
    pDLLNewNode->pPrevNode->pNextNode = pDLLNewNode;

/* change pointer to data */
    pDLLNewNode->pData = pData;

/* update counter information */
    pDLL->ulCount++;

return (1);
}

/****************************************************************/
/**                                                            **/
/**  Call this function to move the DLL Pointer to the head of the **/
/**  linked list.                                              **/
/**                                                            **/
/**  Returns:  no return value                                 **/
/**                                                            **/
/****************************************************************/
void DLLMovePtrToHead( DLLType* pDLL )
{
    pDLL->pPtr = pDLL->pHead;
}

/****************************************************************/
/**                                                            **/
/**  Call this function to move the DLL Pointer to the tail of the **/
/**  linked list.                                              **/
/**                                                            **/
/**  Returns:  no return value                                 **/
/**                                                            **/
/****************************************************************/
void DLLMovePtrToTail( DLLType* pDLL )
{
    pDLL->pPtr = pDLL->pTail;
}

/****************************************************************/
/**                                                            **/
/**  Call this function to move the DLL Pointer to the specified node **/
/**  of the linked list.                                       **/
/**                                                            **/
/**  Returns:  no return value                                 **/
/**                                                            **/
/****************************************************************/
```

```c
void DLLSetPtrToPtr( DLLType* pDLL, DLLNodeType* pDLLNode )
{
    pDLL->pPtr = pDLLNode;
}

/***************************************************************/
/**                                                           **/
/** Call this function to remove the node pointed to by the DLL**/
/** Pointer.                                                  **/
/**                                                           **/
/** Returns:  NULL           if operation failed (list empty) **/
/**           pointer to data if operation successful         **/
/**                                                           **/
/***************************************************************/
void* DLLRemoveAtPtr( DLLType* pDLL )
{
    return DLLRemove( pDLL, pDLL->pPtr );
}

/***************************************************************/
/**                                                           **/
/** Call this function to peek at the node pointed to by the DLL**/
/** Pointer.  The node is not removed from the list, the pointer to**/
/** the data is simply returned.                              **/
/**                                                           **/
/** Returns:  NULL           if operation failed (list empty) **/
/**           pointer to data if operation successful         **/
/**                                                           **/
/***************************************************************/
void* DLLPeekAtPtr( DLLType* pDLL )
{
    return DLLPeek( pDLL, pDLL->pPtr );
}

/***************************************************************/
/**                                                           **/
/** Call this function to peek at the node pointed to by the DLL**/
/** Pointer, and then to advance the DLL Pointer to the next node.**/
/** If the DLL Pointer is NULL (such as is the case when the previous**/
/** call to this function read in the last node), then this function**/
/** returns NULL.                                             **/
/**                                                           **/
/** Returns:  NULL           if list empty or if already read the**/
/**                          last node previously             **/
/**           pointer to data if operation successful         **/
```

```
/**********************************************************************/
/** DLLPeekNextPtr                                                   **/
/**********************************************************************/
void* DLLPeekNextPtr( DLLType* pDLL )
{
    void* pData;

pData = DLLPeekAtPtr( pDLL );

if( pDLL->pPtr != NULL )
    {
        pDLL->pPtr = pDLL->pPtr->pNextNode;
    } return (pData);
}

/**********************************************************************/
/**                                                                  **/
/** Call this function to advance the DLL Pointer to the next node   **/
/** in the list (the node in the direction of the tail node). If the **/
/** pointer currently points to the last node, the pointer does not  **/
/** take on a NULL value; the pointer does not change, and a 0 is    **/
/** returned.                                                        **/
/**                                                                  **/
/** Returns:    0 if operation failed (list empty or already at last **/
/**               node                                               **/
/**             1 if operation successful                            **/
/**                                                                  **/
/**********************************************************************/
int DLLAdvancePtr( DLLType* pDLL )
{
    if( pDLL->pPtr == NULL )
    {
        pDLL->pPtr = pDLL->pHead;
        return (1);
    }
    else if( pDLL->pPtr == pDLL->pTail )
    {
        /* already at end */
        return (0);
    }
    else
    {
```

- 37 -

```
    pDLL->pPtr = pDLL->pPtr->pNextNode;
    return (1);
}

/****************************************************************/
/**                                                            **/
/** Call this function to retreat the DLL Pointer to the previous node **/
/** in the list (the node in the direction of the head node).  If the **/
/** pointer currently points to the first node, the pointer does not **/
/** take on a NULL value; the pointer does not change, and a 0 is **/
/** returned.                                                  **/
/**                                                            **/
/** Returns:  0 if operation failed (list empty or already at first **/
/**                 node                                        **/
/**           1 if operation successful                        **/
/**                                                            **/
/****************************************************************/
int DLLRetreatPtr( DLLType* pDLL )
{
    if( pDLL->pPtr == NULL )
    {
        pDLL->pPtr = pDLL->pTail;
        return (1);
    }
    else if( pDLL->pPtr == pDLL->pHead )
    {
        /* already at end */
        return (0);
    }
    else
    {
        pDLL->pPtr = pDLL->pPtr->pPrevNode;
        return (1);
    }
}

/****************************************************************/
/**                                                            **/
/** Call this function to insert a node pointing to the specified **/
/** data before the node pointed to by the DLL Pointer.        **/
/**                                                            **/
/** Returns:  0 if operation failed (out of memory, etc)       **/
```

- 38 -

```
/**                1 if operation successful                          **/
/**********************************************************************/
int DLLInsertBeforePtr( DLLType* pDLL, void* pData )
{
    return DLLInsertBefore( pDLL, pDLL->pPtr, pData );
}

/**********************************************************************/
/** Call this function to insert a node pointing to the specified    **/
/** data after the node pointed to by the DLL Pointer.               **/
/**                                                                  **/
/** Returns:  0 if operation failed (out of memory, etc)             **/
/**           1 if operation successful                              **/
/**********************************************************************/
int DLLInsertAfterPtr( DLLType* pDLL, void* pData )
{
    return DLLInsertAfter( pDLL, pDLL->pPtr, pData );
}

/**********************************************************************/
/** Call this function to get a pointer to the node pointed to by the **/
/** DLL Pointer.                                                     **/
/**                                                                  **/
/** Returns: NULL          if pointer not valid                      **/
/**          pointer to node if pointer valid                        **/
/**********************************************************************/
DLLNodeType* DLLGetPtrToPtr( DLLType* pDLL )
{
    return pDLL->pPtr;
}

/**********************************************************************/
/** Call this function to determine whether the specified node is    **/
/** contained in the specified linked list.                          **/
/**                                                                  **/
/** Returns:  0 if no node specified or if node not in linked list   **/
/**           1 if node in linked list                               **/
/**********************************************************************/
```

- 39 -

```
int DLLIsNodeInDLL( DLLType* pDLL, DLLNodeType* pDLLNode )
{
    unsigned long ulNumNodes;
    unsigned long ulCounter;
    DLLNodeType* pCurrentNode;

if( pDLLNode == NULL )
    {
        /* error -- supplied pointer invalid */
        return (0);
    } ulNumNodes = pDLL->ulCount;

ulCounter = 0;
    pCurrentNode = pDLL->pHead;

while( (ulCounter<ulNumNodes)   &&
           (pCurrentNode!=NULL)     &&
           (pCurrentNode!=pDLLNode) )
    {
        pCurrentNode = pCurrentNode->pNextNode;
        ulCounter++;
    } if( pCurrentNode == pDLLNode )
        return (1);
    else
        return (0);
}

/*****************************************************************/
/**                                                             **/
/** Call this function to determine the number of nodes in a linked **/
/** list.                                                       **/
/**                                                             **/
/** Returns: the number of nodes in linked list                 **/
/**                                                             **/
/*****************************************************************/
unsigned long DLLCount( DLLType* pDLL )
{
    return (pDLL->ulCount);
}

/*****************************************************************/
```

-40-

```
/******************************************************************/
/**  Call this function to check the integrity of a linked list. This **/
/**  function checks certain criteria about the linked list to make   **/
/**  certain the structure remains valid.  If one suspects that a     **/
/**  linked list has become corrupt, this function should be used.    **/
/**                                                                   **/
/**  Returns:   0 if linked list corrupt                              **/
/**             1 if linked list okay                                 **/
/******************************************************************/
int DLLVerifyIntegrity( DLLType* pDLL )
{
    /* get number of nodes                                            */
    /* start from head and go until                                   */
    /*   (1) null, or                                                 */
    /*   (2) check "number of nodes"                                  */
    /*   --- if reached end too soon or didn't reach end              */
    /*           after checking "number of nodes", violation          */
    /*   --- if last node != tail, violation                          */
    /* start from tail and go until                                   */
    /*   (1) null, or                                                 */
    /*   (2) check "number of nodes"                                  */
    /*   --- if reached end too soon or didn't reach end              */
    /*           after checking "number of nodes", violation          */
    /*   --- if last node != head, violation                          */ unsigned long   ulNumNodes;
    unsigned long   ulCounter;
    DLLNodeType*    pCurrentNode;
    DLLNodeType*    pLastNode;
    int             Violation1 = 0;
    int             Violation2 = 0;
    int             Violation3 = 0;
    int             Violation4 = 0;
    int             Violation5 = 0;
    int             Violation6 = 0;

ulNumNodes = pDLL->ulCount;

ulCounter = 0;
    pCurrentNode = pDLL->pHead;
    pLastNode = NULL;
    while( (ulCounter<ulNumNodes) &&
           (pCurrentNode!=NULL)    )
    {
```

```
        ulCounter++;
        pLastNode = pCurrentNode;
        pCurrentNode = pCurrentNode->pNextNode;
} if( ulCounter != pDLL->ulCount )
        Violation1 = 1;

if( pLastNode != pDLL->pTail )
        Violation2 = 1;

if( pCurrentNode != NULL )
        Violation3 = 1;

ulCounter = 0;
pCurrentNode = pDLL->pTail;
pLastNode = NULL;
while( (ulCounter<ulNumNodes) &&
       (pCurrentNode!=NULL) )
{
        ulCounter++;
        pLastNode = pCurrentNode;
        pCurrentNode = pCurrentNode->pPrevNode;
} if( ulCounter != pDLL->ulCount )
        Violation4 = 1;

if( pLastNode != pDLL->pHead )
        Violation5 = 1;

if( pCurrentNode != NULL )
        Violation6 = 1;

if( Violation1 ||
    Violation2 ||
    Violation3 ||
    Violation4 ||
    Violation5 ||
    Violation6 )
{
        return (0);
}
else
```

```
     return (1);
}

/*******************************************************************/
/**                                                               **/
/** Call this function to determine whether the DLL Pointer is valid **/
/** or not.  The DLL Pointer is invalid under two conditions: (1) at **/
/** startup (because the pointer has not yet been defined), and (2) **/
/** when the node pointed to by the DLL Pointer is removed.       **/
/**                                                               **/
/** Returns:  0 if DLL Pointer invalid                            **/
/**           1 if DLL Pointer valid                              **/
/**                                                               **/
/*******************************************************************/
int DLLIsPtrValid( DLLType* pDLL )
{
     if( pDLL->pPtr == NULL )
         return (0);
     else
         return (1);
}

/*******************************************************************/
/**                                                               **/
/** Call this function to perform a very simple dump of the linked **/
/** list.  The ASCII value of the first byte of the data pointed to **/
/** by each node is printed to the screen, starting from the head and **/
/** ending at the tail.                                           **/
/**                                                               **/
/** Returns:  no return value                                     **/
/**                                                               **/
/*******************************************************************/
void DLLSimpleDump( FILE* pfileOut, DLLType* pDLL )
{
     void* pData;
     DLLNodeType* poldPtr;

/* remember where point used to be */
     poldPtr = DLLGetPtrToPtr( pDLL );

/* move pointer to head */
     DLLMovePtrToHead( pDLL );
```

- 43 -

```c
    /* continue going through list until end */
    while( (pData=DLLPeekNextPtr(pDLL)) != NULL )
        fprintf( pfileOut, "%c ", *((unsigned char*)pData) );

/* move pointer back to original spot */
    DLLSetPtrToPtr( pDLL, pOldPtr );
}

/* DLLIST.H */ define _DLList_h_ struct structDLLNodeType
{
    void*                       pData;
    struct structDLLNodeType*   pNextNode;
    struct structDLLNodeType*   pPrevNode;
};
typedef struct structDLLNodeType DLLNodeType;

struct structDLLType
{
    DLLNodeType*    pHead;
    DLLNodeType*    pTail;
    unsigned long   ulCount;
    int             nID;
    DLLNodeType*    pPtr;
};
typedef struct structDLLType DLLType;

DLLType* DLLCreate();
void DLLDestroy( DLLType* pDLL );

int   DLLInsertAtHead( DLLType* pDLL, void* pData );
int   DLLInsertAtTail( DLLType* pDLL, void* pData );
void* DLLRemoveFromHead( DLLType* pDLL );
void* DLLRemoveFromTail( DLLType* pDLL );
void* DLLRemove( DLLType* pDLL, DLLNodeType* pDLLNode );
void* DLLPeek( DLLType* pDLL, DLLNodeType* pDLLNode );
void* DLLPeekAtHead( DLLType* pDLL );
void* DLLPeekAtTail( DLLType* pDLL );
int   DLLInsertBefore( DLLType* pDLL, DLLNodeType* pDLLNode, void* pData );
int   DLLInsertAfter( DLLType* pDLL, DLLNodeType* pDLLNode, void* pData );
```

```
void DLLMovePtrToHead( DLLType* pDLL );
void DLLMovePtrToTail( DLLType* pDLL );
void DLLSetPtrToPtr( DLLType* pDLL, DLLNodeType* pDLLNode );
void* DLLRemoveAtPtr( DLLType* pDLL );
void* DLLPeekAtPtr( DLLType* pDLL );
void* DLLPeekNextPtr( DLLType* pDLL );
int DLLAdvancePtr( DLLType* pDLL );
int DLLRetreatPtr( DLLType* pDLL );
int DLLInsertBeforePtr( DLLType* pDLL, void* pData );
int DLLInsertAfterPtr( DLLType* pDLL, void* pData );
DLLNodeType* DLLGetPtrToPtr( DLLType* pDLL );

int DLLIsNodeInDLL( DLLType* pDLL, DLLNodeType* pDLLNode );
unsigned long DLLCount( DLLType* pDLL );
int DLLVerifyIntegrity( DLLType* pDLL );
int DLLIsPtrValid( DLLType* pDLL );

/*int DLLSwapNodes( DLLType* pDLL, DLLNodeType* pDLLNode1, DLLNodeType* pDLLNode2 );*/
/*void DLLSimpleDump( FILE* pfileOut, DLLType* pDLL );*/

/* RTOS.CCP */ include <stdio.h>
include <stdlib.h>
#include <string.h>
#include "RTOS.h"

void* GetMessageFromBox( MESSAGEBOX* pMessageBox )
{
    MESSAGE*    pMessage;
    void*       pData;

if( !pMessageBox )
        return NULL;

if( !pMessageBox->pFirstMessage )
        return NULL;

pMessage = pMessageBox->pFirstMessage;
    pMessageBox->pFirstMessage = pMessageBox->pFirstMessage->pNextMessage;

if( pMessageBox->pFirstMessage == NULL )
        pMessageBox->pLastMessage = NULL;
```

```
    pData = pMessage->pData;
    free( pMessage );

return pData;
};

int AddMessageToBox( MESSAGEBOX* pMessageBox, void* pData )
{
    MESSAGE* pNewMessage;

if( !pMessageBox )
        return 0;

pNewMessage = (MESSAGE*)malloc( sizeof(MESSAGE) );

if( !pNewMessage )
        return 0;

pNewMessage->pData = pData;
    pNewMessage->ucFlags = 0;
    pNewMessage->pNextMessage = NULL;

if( pMessageBox->pLastMessage )
    {
        /* not the first message in this message box */
        pMessageBox->pLastMessage->pNextMessage = pNewMessage;
        pMessageBox->pLastMessage = pNewMessage;
    }
    else
    {
        /* first message in this message box */
        pMessageBox->pFirstMessage = pNewMessage;
        pMessageBox->pLastMessage = pNewMessage;
    } return 1;
} int IsMessageInBox( MESSAGEBOX* pMessageBox )
{
    if( !pMessageBox )
        return 0;
```

```
        if( !pMessageBox->pFirstMessage )
            return 0;

return 1;
}

MESSAGEBOX* CreateEmptyMessageBox()
{
        MESSAGEBOX* pNewMessageBox;

pNewMessageBox = (MESSAGEBOX*)malloc( sizeof(MESSAGEBOX) );

if( pNewMessageBox )
        {
                pNewMessageBox->pFirstMessage   = NULL;
                pNewMessageBox->pLastMessage    = NULL;
        } return pNewMessageBox;
} int DestroyMessageBox( MESSAGEBOX* pMessageBox )
{
        MESSAGE* pCurrentMessage;
        MESSAGE* pNextMessage;

if( !pMessageBox )
            return 0;

pCurrentMessage = pMessageBox->pFirstMessage;

while( pCurrentMessage )
        {
                free( pCurrentMessage->pData );
                pNextMessage = pCurrentMessage->pNextMessage;
                free( pCurrentMessage );
                pCurrentMessage = pNextMessage;
        } return 1;
}

/* RTOS.H */
```

```
#ifndef RTOS
define RTOS struct MESSAGEstruct
{
    void*               pData;
    unsigned char       ucFlags;
    struct MESSAGEstruct*   pNextMessage;
};
typedef struct MESSAGEstruct MESSAGE;

struct MESSAGEBOXstruct
{
    struct MESSAGEstruct*   pFirstMessage;
    struct MESSAGEstruct*   pLastMessage;
};
typedef struct MESSAGEBOXstruct MESSAGEBOX;

void*     GetMessageFromBox( MESSAGEBOX* pMessageBox );
int       AddMessageToBox( MESSAGEBOX* pMessageBox, void* pData );
int       IsMessageInBox( MESSAGEBOX* pMessageBox );

MESSAGEBOX* CreateEmptyMessageBox();
int         DestroyMessageBox( MESSAGEBOX* pMessageBox );

#endif

/* TOOLS.CCP */ include "tools.h"
include "math.h"

unsigned __int32 ExtendSeqNum(unsigned char SeqNum, unsigned __int32 PrevSeqNum)
{
    // figure out the LL internal sequence number
    // its the 32 bit unsigned integer the closest to the
    // Extended SeqNum PrevSeqNum of the last packet
    unsigned __int32 x, r, FofR1, FofR0, FofR_1, ReturnSeqNum;
    x=(PrevSeqNum/256);

r=x+1; FofR1 =abs((256*r+SeqNum)-(PrevSeqNum));
    r=x;   FofR0 =abs((256*r+SeqNum)-(PrevSeqNum));
    if (x>0) {
        r=x-1; FofR_1=abs((256*r+SeqNum)-(PrevSeqNum));}
```

```
          else{
               FofR_1=256;} if(FofR1<FofR0){
               if(FofR1<FofR_1){
                    r=x+1;}
               else{
                    r=x-1;}}
          else{
               if(FofR0<FofR_1){
                    r=x;}
               else{
                    r=x-1;}}
          ReturnSeqNum = 256*r+SeqNum;
          return ReturnSeqNum;
}

/* TOOLS.H */ ifndef TOOLS
define TOOLS unsigned __int32 ExtendSeqNum(unsigned char SeqNum, unsigned __int32 PrevSeqNum);

endif

/* TYPES.CCP */ include "types.h"
include "stdio.h"

void PrintPacket(PKT* pPacket)
{
     printf("+++ Packet +++\n");
     if (pPacket==NULL)
     {
          printf("NULL pointer \n");
     }
     else
     {
          printf("SeqNum: %d\n",pPacket->SeqNum);
          printf("nLengthBytes: %d\n",pPacket->nLengthBytes);
          for(int i=0; i<pPacket->nLengthBytes;i++)
```

```
    {
        printf("%03i=%c, ",*(((unsigned char*)pPacket->pData)+i),
            *(((unsigned char*)pPacket->pData)+i));
    }
    printf("\n");
}

/* TYPES.H */ ifndef TYPES
define TYPES include "windows.h"   //for the definition of WORD struct PKTstruct
{
    void* pData; /*Bytes*/
    WORD nLengthBytes;
    unsigned char SeqNum;
};
typedef struct PKTstruct PKT;

// a simple print routine for the packet structure
// is in the "types.cpp" file
void PrintPacket(PKT* pPacket);

#endif

/* XOR_CODER.CPP */

/**************************************************************/
/*                                                            */
/* xor_coder.c                                                */
/*                                                            */
/* 10/15/97                                                   */
/*                                                            */
/* Guido Schuster                                             */
/* Advanced Technologies                                      */
/* Carrier Systems Division                                   */
/* 3COM                                                       */
/* 1800 W. Central Rd.                                        */
/* Mount Prospect, Il 60056                                   */
```

/*****************************************************************************
/* This file is the implementation of a xor based channel coder for packets. The basic idea   */
/* behind this scheme is that we calculate a redundancy (parity) packet, using k previous     */
/* packets. This redundancy packet is then appended to the current packet and                 */
/* shipped off. Since this is done for every packet and not, as it is commonly done for       */
/* block codes, every block, this results in an overall scheme able to recover up to k        */
/* packet losses in a row. Clearly the bit rate roughly doubles, but the packet rate stays    */
/* constant since the additional information is appended. Note that the xor_coder.c is        */
/* meant to work hand in hand with the xor_decoder.c                                          */
/*****************************************************************************

/********************* The Include Files *******************************/
include "stdlib.h"  // the standard ones
include "malloc.h"
include "string.h"
include "windows.h"

include "types.h"      // commonly used types
include "RTOS.h"       // definition of the message boxes
include "xor_coder.h"  // the header file extern "C"
{
include "dllist.h" // the doubly linked list
}
/*****************************************************************************

/********************* Global static variables *************************/
static unsigned int n_old=0; // the old block lenght, used instead of n
static unsigned int k_old=0; // the old data length, for the xor coder =n-1
/*****************************************************************************

/********************* The Functions ***********************************/

/*****************************************************************************
/* **************** The Initialization Routine *************************  */
/* This routine must be called before the encoder is called. It sets the block size n and    */
/* generates k (=n-1) previous empty packets, which are sent to the encoder inbox and the    */
/* the resulting packets are removed from the outbox. The same procedure is done at the      */
/* decoder and hence encoder and decoder have the same history after the initialization.     */
/* By doing this, the first k real packets received do not have to be treated differently    */

-51-

```
/* than any other packets.
void init_xor_coder(unsigned char n)
{
    // the message boxes used to pass the data around
    MESSAGEBOX* pInBox=CreateEmptyMessageBox();
    MESSAGEBOX* pOutBox=CreateEmptyMessageBox();

// the data packets used to put into the InBox and take out of the OutBox
    PKT* pOutPacket;
    PKT* pInPacket;

// Does the xor coder need to be initilized?
    if (n!=n_old)
    {
        n_old=n;
        k_old=n-1;
    }

// create the k_old packets which are used for the initial state
    for(unsigned char i=0; i<k_old;i++)
    {
        // create empty packet
        pInPacket=new PKT;
        pInPacket->nLengthBytes=0;
        pInPacket->pData=NULL;

AddMessageToBox(pInBox,(void*)pInPacket);
        xor_coder(pInBox,pOutBox);
        pOutPacket=(PKT*)GetMessageFromBox(pOutBox);

free(pOutPacket->pData);
        delete pOutPacket;
    }

DestroyMessageBox(pInBox);
    DestroyMessageBox(pOutBox);
}
/******************************************************************************/

/******************************** The Xor Encoder *****************************/
/* This is the main routine of this file. It receives data packets in its inbox and puts the*/
```

```
/* modified packets in its outbox.  The modified packets have a sequence number, the      */
/* selected n and k (since k=n-1, k could be neglected) and the redundancy added. The basic */
/* flow of the algorithm is as follows. We get the data packet and add the sequence number. */
/* then n and k are added and two bytes to indicated the length of the original data. Then  */
/* the original data follows. If there is redundancy, then two bytes are added to indicate  */
/* the length of the redundancy (if there is no redundancy, then the two bytes are set to   */
/* zero) and the redundancy is added. The packet is put into the outbox. It is also added   */
/* into a doubly linked list which holds the last k packets. Then the next redundancy packet*/
/* is calculated and stored for appending it to the next data packet and the last entry in  */
/* the linked list is erased since it is no longer required.                                */
void xor_coder(MESSAGEBOX* pInBox, MESSAGEBOX* pOutBox)
{
  static unsigned char i_p=0; //counting the parity packet, its 0 or 1
  static unsigned char SeqNum=0; // counter of the Sequence Numbers
  PKT *pDataListEntry; // pointer to an element in the LL
  PKT *pOutPacket;     // Packet we return
  PKT *pInPacket;      // packet we receive
  static PKT *pParityPacket; // used to store the parity data
  int nByte; // a counter which is used to traverse the data
  static DLLType *pDataList=DLLCreate(); // the DLL used to store the last k data packets //get the packet
  pInPacket=(PKT*) GetMessageFromBox(pInBox);
  if(pInPacket==NULL) return; // no packet, no service // create the outgoing data packet
  pOutPacket = new PKT;
  // the format is as follows: Byte 1: SeqNum, Byte 2: n_old, Byte 3: k_old
  // Byte 4,5 Data Lenght, Byte 6..6+DataLength-1: Data, next two bytes: Redundancy length
  // after that its all redundancy
  if(i_p) // parity bytes available
  {        // yes
    pOutPacket->nLengthBytes=5+pInPacket->nLengthBytes+2+pParityPacket->nLengthBytes;
  }
  else
  {        // no
    pOutPacket->nLengthBytes=5+pInPacket->nLengthBytes+2;
  }
  pOutPacket->pData=malloc(pOutPacket->nLengthBytes * sizeof(unsigned char));
  // write SeqNum
  *((unsigned char*)pOutPacket->pData)=SeqNum;
  // also add the SeqNum to the out gong packet
  pOutPacket->SeqNum=SeqNum;
  // increase the counter
  SeqNum++;
```

```
// write n_old and k which is n-1
*(((unsigned char*)pOutPacket->pData)+1)=n_old;
*(((unsigned char*)pOutPacket->pData)+2)=k_old;
// write the Data Length
*((WORD*)(((unsigned char*)pOutPacket->pData)+3))=(WORD) pInPacket->nLengthBytes;
// copy the incomming data to the outgoing packet
memmove(((unsigned char*)pOutPacket->pData)+5, pInPacket->pData,pInPacket->nLengthBytes );
// if the parity data is available, add that to the outgoing packet
if(i_p)
{
    // write the length of the parity data
    *((WORD*)(((unsigned char*)pOutPacket->pData)+5+pInPacket->nLengthBytes))=
                (WORD) pParityPacket->nLengthBytes;
    // copy parity
    memmove((((unsigned char*)pOutPacket->pData)+5+pInPacket->nLengthBytes+2),
            pParityPacket->pData,pParityPacket->nLengthBytes);
    // the parity has been read, we free the memory
    free(pParityPacket->pData);
    delete pParityPacket;
    i_p--;
}
else
{
    // write the length of the parity data, which is zero
    *((WORD*)(((unsigned char*)pOutPacket->pData)+5+pInPacket->nLengthBytes))=
            (WORD)0;
}

// we can now put the data into the out box
AddMessageToBox(pOutBox,(void*) pOutPacket);

// put packets into the LL
DLLInsertAtTail(pDataList,pInPacket);

// do we have k (=n-1) data packets to run the xor coder?
if (DLLCount(pDataList)==k_old)
{   // allocate the space for the parity and set it to zero
    // The space needed for the parity is the maximum of the
    // length of the data lenght's
    pParityPacket=new PKT;
    pParityPacket->nLengthBytes=0;
    DLLMovePtrToHead(pDataList);
    while(pDataListEntry=(PKT*)DLLPeekNextPtr(pDataList))
    {
```

-54-

```c
        if(pDataListEntry->nLengthBytes>pParityPacket->nLengthBytes)
        {
            pParityPacket->nLengthBytes=pDataListEntry->nLengthBytes;
        }
    }
    // add the 2 data length Bytes
    pParityPacket->nLengthBytes+=2;
    pParityPacket->pData=calloc(pParityPacket->nLengthBytes,1);
    i_p++;

// the outer loop going through the packets
    DLLMovePtrToHead(pDataList);
    while(pDataListEntry=(PKT*)DLLPeekNextPtr(pDataList))
    {   // first do the 2 Data Length Bytes
        for (nByte=0; nByte<2; nByte++)
        {
            *(((unsigned char*)(pParityPacket->pData)+nByte)^=
                *(((unsigned char*)(&(pDataListEntry->nLengthBytes)))+nByte);
        }

// Now do the loop going through the Data bytes
        for(nByte=0; nByte<pParityPacket->nLengthBytes-2; nByte++)
        {
            // is zero padding required? Then we don't include it in the XOR
            if (nByte<pDataListEntry->nLengthBytes)
            {
                *(((unsigned char*)(pParityPacket->pData))+nByte+2)^=
                    *((unsigned char*)(pDataListEntry->pData)+nByte);
            }
        }
    }

// Remove the Head
    pDataListEntry=(PKT*)DLLRemoveFromHead(pDataList);
    free(pDataListEntry->pData);
    delete pDataListEntry;
}
/***************************************************************************/
/* XOR_CODER.H */ ifndef XOR_CODER
define XOR_CODER
```

```
#include "types.h"

// the init function needs to be called before the
// encoder can be used. The parameter n is the
// block length. I.e., the XOR over n-1 (=k)
// packets is sent with the n-th packet
void init_xor_coder(unsigned char n);

// the coder takes a pointer to PKT from its
// inbox, processes it and puts a pointer to the
// output packet into the outbox.
// The output packet is the original data,
// and the appended redundancy
// Note that some additional info is also
// put out, such as sequence number and lenght info
void xor_coder(MESSAGEBOX* pInBox, MESSAGEBOX* pOutBox);

#endif

/* XOR_DECODER.CPP */
/***************************************************************/
/*                                                             */
/* xor_decoder.c                                               */
/*                                                             */
/* 10/15/97                                                    */
/*                                                             */
/* Guido Schuster                                              */
/* Advanced Technologies                                       */
/* Carrier Systems Division                                    */
/* 3COM                                                        */
/* 1800 W. Central Rd.                                         */
/* Mount Prospect, Il 60056                                    */
/*                                                             */
/* This file is the implementation of a xor based channel decoder for packets. The idea */
/* behind this scheme is that we calculate a redundancy (parity) packet, using k previous */
/* packets. This redundancy packet is then appended to the current packet and */
/* shipped off. Since this is done for every packet and not, as it is commonly done for */
/* block codes, every block, this results in an overall scheme able to recover up to k */
/* packet losses in a row. Clearly the bit rate roughly doubles, but the packet rate stays */
/* constant since the additional information is appended. */
```

```
/* The basic algorithm for the efficient decoding of the xor encoded packet stream works as  */
/* follows. After the arrival of a packet, we check if we can use the additional information */
/* to recover a missing data packet. Each packet has a sphere of influence, in the sense     */
/* that it carries the parity frame of the previous k frames and is part of the calculation  */
/* for the redundancy of the next k frames. In other words, having knowledge about this      */
/* frame might enable us to recover a missing packet only within this sphere. If we can      */
/* recover a packet, then this new information broadens the sphere of influence. This is     */
/* done until all packets which we can recover are recovered. Note that the xor_decoder.c is */
/* meant to work hand in hand with the xor_coder.c                                           */
/*******************************************************************************************/

/********************************* The Include Files ***************************************/
#include "stdlib.h"  // the standard include files
#include "malloc.h"
include "string.h"
include "windows.h"
#include "math.h"

#include "types.h"       // the commonly used types
#include "RTOS.h"        // implementation of the mailbox principle
#include "tools.h"       // functions used in more than one file
include "xor_decoder.h" // the obvious extern "C"
{ include "dllist.h" // the doubly linked list

}
/*******************************************************************************************/

/******************************* The Global Variables **************************************/
static unsigned int n_old=0, k_old=0; // store the block size n and the message length k=n-1
static int BufferLength_old=0; // target size of buffer in bytes
static unsigned __int32 PrevSeqNum=0; // extended sequence number of previously arrived packet
static DLLType *pList=DLLCreate(); // the doubly linked list storing the data and redundancy
/*******************************************************************************************/

/************************************* The Types *******************************************/
struct NODEstruct // node of the dll
{
    PKT* pDataPacket; // store the data
    PKT* pRedundancyPacket; // store the redundancy
    unsigned __int32 SeqNum; // the extended sequence number
```

```
};
typedef struct NODEstruct Node_t;
/***************************************************************************/

/***************************** The Functions *******************************/
/***************************** Put Node ************************************/
/* The input to the PutNode function is a pointer to a data packet and a pointer to a parity*/
/* packet. Both packets have the same sequence number and the extended sequence number is  */
/* is the third parameter.  PutNode creates a dll node and puts it into the buffer according*/
/* to the extended sequence number.  It also returns a pointer to the DLLNode which was    */
/* inserted in the dll to accomodate the new packets.  This pointer is later used as a      */
/* starting point for the packet recover routine.                                           */
DLLNodeType* PutNode(PKT* pDataPacket, PKT* pRedundancyPacket, unsigned __int32 ExtSeqNum)
{
    unsigned __int32 i;  // all purpose counter
    Node_t *pTempNode;   // a temporary node used to count through the dll
    DLLNodeType *pReturn;  // this is where we store the pointer which we return at the end // function prototyp, doing the obvious
    void KillNode(Node_t *p);

// create the node
    Node_t *pNewNode=new Node_t;
    pNewNode->pDataPacket=pDataPacket;
    pNewNode->pRedundancyPacket=pRedundancyPacket;
    pNewNode->SeqNum=ExtSeqNum;

// check if the DLL exists
    if (!DLLCount(pList))
    {   // empty DLL
        DLLInsertAtHead(pList,pNewNode);
        DLLMovePtrToHead(pList);
        pReturn=DLLGetPtrToPtr(pList);
    }
    else
    {   // DLL exists
        pTempNode=(Node_t*)DLLPeekAtHead(pList);
        unsigned __int32 HeadSeqNum = pTempNode->SeqNum;
        if (HeadSeqNum> pNewNode->SeqNum)
        {   // new node to the right of head, create the empty nodes
            for (i=HeadSeqNum-1; i>pNewNode->SeqNum; i--)
            {   // go through the SeqNum's of the missing nodes
```

- 58 -

```
            pTempNode=new Node_t;
            pTempNode->SeqNum=i;
            pTempNode->pDataPacket=NULL;
            pTempNode->pRedundancyPacket=NULL;
            DLLInsertAtHead(pList,pTempNode);
      }
      // Now insert the new node
      DLLInsertAtHead(pList,pNewNode);
      DLLMovePtrToHead(pList);
      pReturn=DLLGetPtrToPtr(pList);
   }
   else
   {  // node not to the right of head
      pTempNode=(Node_t*)DLLPeekAtTail(pList);
      unsigned __int32 TailSeqNum = pTempNode->SeqNum;
      if (pNewNode->SeqNum > TailSeqNum)
      {  // node to the left of tail, create the empty nodes
         for (i=TailSeqNum+1; i<pNewNode->SeqNum; i++)
         {  // go through the SeqNum's of the missing nodes
            pTempNode=new Node_t;
            pTempNode->SeqNum=i;
            pTempNode->pDataPacket=NULL;
            pTempNode->pRedundancyPacket=NULL;
            DLLInsertAtTail(pList,pTempNode);
         }
         // Now insert the new node
         DLLInsertAtTail(pList,pNewNode);
         DLLMovePtrToTail(pList);
         pReturn=DLLGetPtrToPtr(pList);
      }
      else
      {  // Node between head and tail, find the corresponding node
         DLLMovePtrToHead(pList);
         pTempNode=(Node_t*)DLLPeekAtPtr(pList);
         while (pTempNode->SeqNum!=pNewNode->SeqNum)
         {
            DLLAdvancePtr(pList);
            pTempNode=(Node_t*)DLLPeekAtPtr(pList);
         }
         // the intenal DLL ptr points to the node we are looking for
         // we now exchange that node with the new node
         DLLInsertBeforePtr(pList,pNewNode);
         DLLRetreatPtr(pList);
         pReturn=DLLGetPtrToPtr(pList);
         DLLAdvancePtr(pList);
```

```
        pTempNode=(Node_t*)DLLRemoveAtPtr(pList);
        KillNode(pTempNode);
    }
    return pReturn;
}
/**************************************************************************/
/************************ Initialization Routine *************************/
/* This routine must be called before the xor_decoder is envoked, since the block size n and*/
/* the message lenght k are set in here. Furthermore the desired bufferdepth is also set    */
/* using the BufferLength parameter which is the number of bytes which should be used for   */
/* storing the data and the redundancy packets. In addition, k empty packets are sent into  */
/* the decoder, which is also done at the encoder and hence encoder and decoder are in the  */
/* same state. This is done so that the first k real packets do not have to be treated      */
/* differently form the other packets.                                                      */
void init_xor_decoder(unsigned char n, int BufferLength)
{
    MESSAGEBOX* pInBox=CreateEmptyMessageBox();
    MESSAGEBOX* pOutBox=CreateEmptyMessageBox();

PKT* pInPacket;
    PKT* pOutPacket;

// Does the xor decoder need to be initilized?
    if (n!=n_old)
    {
        n_old=n;
        k_old=n-1;
    }

// Adjust Buffer Size
    if (BufferLength_old!=BufferLength)
    {
        BufferLength_old=BufferLength;
    }

// create the k empty packets
    for(unsigned char i=0; i<k_old;i++)
    {
        pInPacket=new PKT;
```

-60-

```
    pInPacket->nLengthBytes=7;
    pInPacket->pData=malloc(pInPacket->nLengthBytes*sizeof(unsigned char));
    *((unsigned char*)pInPacket->pData)=i;
    *((unsigned char*)pInPacket->pData+1)=(unsigned char)n_old;
    *((unsigned char*)pInPacket->pData+2)=(unsigned char)(k_old);
    *((WORD*)((unsigned char*)pInPacket->pData+3))=(WORD)0;
    *((WORD*)((unsigned char*)pInPacket->pData+5))=(WORD)0;

// pass the packet to the xor_decoder
    AddMessageToBox(pInBox,(void*)pInPacket);
    xor_decoder(pInBox,pOutBox);
    pOutPacket=(PKT*)GetMessageFromBox(pOutBox);

free(pOutPacket->pData);
    delete pOutPacket;
    }

DestroyMessageBox(pInBox);
    DestroyMessageBox(pOutBox);
}
/******************************************************************************/

/******************************************************************************/
/************************* My_malloc ******************************************/
/* This routine, together with "AdjustMemory", is used to control the amount of memory */
/* used for storing past data packets and past redundancy. During initialization, the  */
/* desired number of bytes is stored in the global variable BufferLength_old.Whenever memory*/
/* is allocated to store the data or the redundancy, my_malloc instead of malloc is called.*/
/* My_malloc behaves like malloc and in addition, it subtracts the used bytes from the     */
/* available bytes.                                                                        */
static void *my_malloc(size_t size)
{
    BufferLength_old-=size;
    return malloc(size);
}
/******************************************************************************/

/******************************************************************************/
/********************* Adjust Memory ******************************************/
/* This function is called after all the processing for a newly arrived packet has been done*/
/* It simply goes through the doubly linked list, erasing nodes at the head (past) until the*/
```

```
/* size of the buffer (pList) is just below the set target BufferLength_old     */
void AdjustMemory(void)
{
    void KillNode(Node_t *p);  // function prototyp
    Node_t *p;
    while(BufferLength_old<=0)
    {
        p=(Node_t*) DLLRemoveFromHead(pList);
        KillNode(p);
    }
}

/*****************************************************  Kill Node  ****************************************************/
/* a node of the dll is erased,i.e., the memory it occupies is given back                                              */
void KillNode(Node_t *p)
{
    if(p!=NULL)  // no node, no kill
    {   // kill!
        if(p->pDataPacket!=NULL)  // no data, no kill
        {   // kill and keep book
            BufferLength_old+=p->pDataPacket->nLengthBytes;
            free (p->pDataPacket->pData);
            delete p->pDataPacket;
        }
        if(p->pRedundancyPacket!=NULL)  // no redundancy, no kill
        {   // kill and keep book
            BufferLength_old+=p->pRedundancyPacket->nLengthBytes;
            free (p->pRedundancyPacket->pData);
            delete p->pRedundancyPacket;
        }
        delete p;
    }
}
/***********************************************************************************************************************/

/************************************************ XOR decoder *********************************************************/
/* This is the main routine of this file.  It is meant to work hand in hand with the                                  */
/* xor_encoder, using the same block lenght n.  It receives the packets through a inbox                               */
/* and returns the data packets and the recovered packets to an outbox.                                               */
```

```
/* The basic algorithm is like this: The packet is taken from the inbox and the data is     */
/* quickly forwarded to the outbox.  Then the data and the redundancy are entered in the    */
/* buffer structure.  Then the recovery algorithm is run starting at the position where the */
/* data was entered.  If data can be recovered, it is also put into the outbox until no more*/
/* data can be recovered. Note that the sequence number field of the out stream is used     */
void xor_decoder(MESSAGEBOX* pInBox, MESSAGEBOX* pOutBox)
{
    PKT *pInPacket;
    PKT *pOutDataPacket=new PKT;
    PKT *pRedundancyPacket;
    PKT *pDataPacket=new PKT;
    PKT *pParityPacket;

// First thing we do is to get the data (i.e., the redundancy is not copied)
    // and put it into the OutBox
    pInPacket = (PKT*) GetMessageFromBox(pInBox);
    if (!pInPacket) return; // no packet, no service
    // explicitly add the sequence number
    pOutDataPacket->SeqNum=*((unsigned char*)(pInPacket->pData));
    // figure out the extended sequence number and store it as the previous one
    int32 ExtSeqNum=ExtendSeqNum(pOutDataPacket->SeqNum,PrevSeqNum);
    PrevSeqNum=ExtSeqNum;
    // read the (n,k)
    n_old =*(((unsigned char*)(pInPacket->pData))+1);
    k_old =*(((unsigned char*)(pInPacket->pData))+2);
    // read the data length
    pOutDataPacket->nLengthBytes=
        *((WORD*)(((unsigned char*)(pInPacket->pData))+3));
    // Read the length of the redundancy
    int RedundancyLength=
        *((WORD*)(((unsigned char*)(pInPacket->pData))+5+pOutDataPacket->nLengthBytes));
    if (RedundancyLength==0)
    { // No redundancy sent
        pRedundancyPacket=NULL;
    }
    else
    {
        // copy the redundancy
        pRedundancyPacket = new PKT;
        pRedundancyPacket->nLengthBytes=RedundancyLength;
        pRedundancyPacket->SeqNum=pOutDataPacket->SeqNum;
        pRedundancyPacket->pData=my_malloc(pRedundancyPacket->nLengthBytes * sizeof(unsigned char));
        memmove(pRedundancyPacket->pData,(((unsigned char*)(pInPacket->pData))+5+
            pOutDataPacket->nLengthBytes+2),pRedundancyPacket->nLengthBytes);
    }
```

```
// copy the data to the out packet
pOutDataPacket->pData=malloc(pOutDataPacket->nLengthBytes * sizeof(unsigned char));
memmove(pOutDataPacket->pData,(((unsigned char*)(pInPacket->pData))+5),pOutDataPacket->nLengthBytes);

// Before we place the data into the outbox, we need a local
// copy, which includes the two data length bytes
pDataPacket->nLengthBytes=pOutDataPacket->nLengthBytes+2;
pDataPacket->SeqNum = pOutDataPacket->SeqNum;
pDataPacket->pData=my_malloc(pDataPacket->nLengthBytes * sizeof(unsigned char));
memmove(pDataPacket->pData,(((unsigned char*)(pInPacket->pData))+3),pDataPacket->nLengthBytes);

// put the data into the OutBox
AddMessageToBox(pOutBox, (void*) pOutDataPacket);

// put the copy of the data and the redundancy into the LL
DLLNodeType *pI = PutNode(pDataPacket, pRedundancyPacket,ExtSeqNum);

// free the memory occupied by InPacket
free(pInPacket->pData);
delete pInPacket;

// recover lost packets
Node_t *pMissingData; // pointer to the missing data
Node_t *pINode;  // pointer for the first loop
Node_t *pIINode; // pointer for the second loop
unsigned int i, NumOfMissingData=0;
unsigned __int32 LL; // the lower limit SeqNum for the recovery // initialize
Node_t *pHead=(Node_t*)DLLPeekAtHead(pList);
DLLSetPtrToPtr(pList,pI);
pINode=(Node_t*)DLLPeekAtPtr(pList);
LL = pINode->SeqNum-k_old<pHead->SeqNum ? pHead->SeqNum : pINode->SeqNum-k_old;

// the main recovery loop
while(pI && pINode->SeqNum>=LL)
{
    // first we find out how many packets are missing
    NumOfMissingData=0;
    DLLSetPtrToPtr(pList,pI);
    for(i=0; i<k_old && (pIINode=(Node_t*)DLLPeekNextPtr(pList)); i++)
    {
        if(!pIINode->pDataPacket) NumOfMissingData++;
    }
```

```
if(i==k_old && NumOfMissingData==1 &&
   (pIINode=(Node_t*)DLLPeekNextPtr(pList)) && pIINode->pRedundancyPacket)
{
    // we have the Redundancy and only one packet is lost out of k_old
    // hence we can recover that packet // allocate the space for the parity and set it to zero
    // we need as many bytes as the redundancy is long
    pParityPacket=new PKT;
    pParityPacket->nLengthBytes=pIINode->pRedundancyPacket->nLengthBytes;
    pParityPacket->pData=calloc(pParityPacket->nLengthBytes,1);

DLLSetPtrToPtr(pList,pI);
    for(i=0;i<k_old;i++)  // go through the k last data packets
    {
        pIINode=(Node_t*)DLLPeekAtPtr(pList);
        if(!pIINode->pDataPacket) // no data
        {
            // store the pointer to the missing data
            pMissingData=pIINode;
            // reset the pointers since we will recover this packet
            pI=DLLGetPtrToPtr(pList);
            // recalc the lower limit
            LL= LL<=pIINode->SeqNum-k_old ? LL : pIINode->SeqNum-k_old;
            // check the limit
            LL= LL<pHead->SeqNum ? pHead->SeqNum : LL;
        }
        else
        {
            // do the XOR operation for every Byte
            for (int Byte=0; Byte<pIINode->pDataPacket->nLengthBytes;Byte++)
                *(((unsigned char*)(pParityPacket->pData)+Byte)^=
                 *(((unsigned char*)pIINode->pDataPacket->pData)+Byte);
        }
        DLLAdvancePtr(pList);
    }
    // Finally, we need to do the XOR with the redundancy
    // do the XOR operation for every Byte
    pIINode=(Node_t*)DLLPeekAtPtr(pList);
    for (int Byte=0; Byte<pIINode->pRedundancyPacket->nLengthBytes;Byte++)
        *(((unsigned char*)(pParityPacket->pData)+Byte)^=
         *(((unsigned char*)pIINode->pRedundancyPacket->pData)+Byte);
}
```

```
        // build a packet for the recovered data
        pMissingData->pDataPacket=new PKT;
        // set the correct SeqNum
        pMissingData->pDataPacket->SeqNum=
          (unsigned char) (pMissingData->SeqNum % 256);
        // write the correct length for the data into the structure
        // Note that 2 Length bytes are also in the structure
        // this adjustment is done later on
        pMissingData->pDataPacket->nLengthBytes=*((WORD*)pParityPacket->pData);
        // correct for the additional 2 data length bytes
        pMissingData->pDataPacket->nLengthBytes+=2;
        // copy the data
        pMissingData->pDataPacket->pData=
                my_malloc(pMissingData->pDataPacket->nLengthBytes*sizeof(unsigned char));
        memmove(pMissingData->pDataPacket->pData,
                pParityPacket->pData,pMissingData->pDataPacket->nLengthBytes);
        // free the temp data storage
        free(pParityPacket->pData);
        delete pParityPacket;

// create a packet to be put into the outbox
        pOutDataPacket=new PKT;
        // explicitly add the sequence number
        pOutDataPacket->SeqNum= (unsigned char) (pMissingData->SeqNum % 256);
        // add the length, subtract the 2 length bytes
        pOutDataPacket->nLengthBytes=pMissingData->pDataPacket->nLengthBytes-2;
        // copy the data, not including the two data length bytes
        pOutDataPacket->pData=malloc(pOutDataPacket->nLengthBytes * sizeof(unsigned char));
        memmove(pOutDataPacket->pData,(((unsigned char*)(pMissingData->pDataPacket->pData))+2),
                pOutDataPacket->nLengthBytes);
        // put the data into the OutBox
        AddMessageToBox(pOutBox, (void*) pOutDataPacket);
    }
    else
    {
        // we cannot recover any data, move the block backwards
        DLLSetPtrToPtr(pList,pI);
        if(DLLRetreatPtr(pList))
        {
                pI=DLLGetPtrToPtr(pList);
                pINode=(Node_t*)DLLPeekAtPtr(pList);
        }
```

```
        else
        {
            pI=NULL;
        }
    }
    AdjustMemory();
}
/*******************************************************************/

/* XOR_DECODER.H */ ifndef XOR_DECODER
define XOR_DECODER include "types.h"

void xor_decoder(MESSAGEBOX* pInBox, MESSAGEBOX* pOutBox);

void init_xor_decoder(unsigned char n, int BufferLenght);

#endif
```

The computer processor and/or machine language instructions that carries out the encoding function according to the present invention may be referred to as a first segment of a communication apparatus, and a device that transmits the resulting encoded packets according to the present invention may be referred to as a second segment of the communication apparatus. In turn, the computer processor and/or machine language instructions that recreates a lost payload packet by extracting information from other packets may be referred to as a third segment of the communication apparatus. Alternatively, it will be appreciated that the various components required to carry out the present invention may be divided into other segments of a communication apparatus.

As the foregoing illustrates, the present invention provides a computationally simple mechanism for encoding and decoding a sequence of packets in order to recover lost packets. Beneficially, the invention accomplishes this function without increasing packet rate and without substantially increasing the data rate of transmission beyond the single FEC block (and trivial amount of other overhead) added to each payload packet. As the window size w is increased, provided with successful transmission and receipt of sufficient adjacent data blocks, the present invention conveniently enables the recovery from larger burst errors. The present invention thus provides a powerful mechanism for reducing the effect of packet loss, by establishing high order redundancy through the use of a sliding window and an efficient forward error correction code as described above.

A preferred embodiment of the present invention has been illustrated and described. It will be understood, however, that changes and modifications may be made to the invention without deviating from the spirit and scope of the invention, as defined by the following claims.

We claim:

1. A method for communicating payload in a digital transmission system, said payload being divided into a sequence of payload packets, PL[k−w], . . . , PL[k−1], PL[k−2], PL[k], PL[k+1], . . . , PL[k+u], said method comprising, in combination:

to each payload packet PL[k], appending a forward error correction code FEC[k] comprising the XOR sum of a predetermined number of preceding payload packets, said predetermined number being greater than 1, said payload packet PL[k] and said forward error correction code FEC[k] defining, in combination, a packet P[k]; and transmitting a sequence of said packets P[k], P[k+1], . . . , P[k+u] from a first device in said digital transmission system for receipt by a second device in said digital transmission system.

2. A method as claimed in claim 1, wherein, if a packet P[j] is lost in transmission, said second device recreates payload packet PL[j] by a process comprising extracting information from one or more packets that follow packet P[j].

3. A method as claimed in claim 2, wherein said predetermined number defines a length of burst error from which said receiving location may recover payload.

4. A method as claimed in claim 3, wherein said predetermined number is 2.

5. A method as claimed in claim 3, wherein said predetermined number is 3.

6. A method as claimed in claim 1, wherein said payload represents a real-time media signal.

7. A method as claimed in claim 6, wherein said payload represents a voice signal.

8. A method as claimed in claim 1, further comprising, in order:

padding a plurality of said payload packets, to force said payload packets to be equal in length to each other; and generating said XOR sum.

9. A method as claimed in claim 1, further comprising:

applying a sliding window along said sequence of payload packets and, within said sliding window, generating and appending said FEC.

10. A method for communicating payload in a digital transmission system, said payload being divided into a sequence of payload packets, PL[k−w], . . . , PL[k−1], PL[k−2], PL[k], PL[k+1], . . . , PL[k+u], said method comprising, in combination:

to each payload packet PL[k], appending a forward error correction code FEC[k]=PL[k−1] XOR PL[k−2] XOR, . . . , XOR PL[k−w], said payload packet and forward error correction code defining, in combination, a packet P[k]; and transmitting a sequence of said packets P[k], P[k+1], . . . , P[k+u], from a first location in said digital transmission system for receipt at a second location in said digital transmission system.

11. A method of encoding a sequence of packets in a transmission system to enable recovery of lost packets, each of said packets comprising a payload block, said method comprising, in combination, for each sequential group of w packets, computing an XOR sum of said payload blocks in said group of w packets and combining said XOR sum with a packet sequentially following said w packets, whereby, if up to w sequential payload blocks are thereafter lost in transmission, said up to w sequential payload blocks may be recovered through extraction from said XOR sum in combination with other payload blocks in said sequence.

12. A method of recovering a lost packet in a sequence of packets transmitted in a telecommunications system, each packet in said sequence defining a sequence number and carrying a payload block and a redundancy block, said redundancy block in a given packet being defined by an XOR sum of a predetermined number of preceding payload blocks in said sequence, said method comprising, in combination:

(a) receiving an incoming packet of said sequence;

(b) establishing a window of analysis beginning with said incoming packet and extending for said predetermined number of packets of said sequence following said incoming packet; and (c) if only one payload block in said window of analysis has not yet been received, recovering said one payload block by taking an XOR sum of a plurality of payload blocks within said window of analysis.

13. A method as claimed in claim 12, further comprising, in combination:

if all of the payload blocks in said window of analysis have been received, or if more than one of said payload blocks in said window of analysis have not yet been received, moving said window of analysis back by one packet so that the window of analysis begins with one packet of said sequence prior to incoming packet and extends for said predetermined number of packets of said sequence following said one packet; and repeating step (c) of claim 12.

14. An apparatus for communicating payload in a digital transmission system, said payload being divided into a sequence of payload packets, PL[k−w], ... , PL[k−1], PL[k−2], PL[k], PL[k+1], ... , PL[k+u], said apparatus comprising, in combination:

a computer processor;

a memory;

a first segment for appending to each payload packet PL[k] a forward error correction code FEC[k] equal to the XOR sum of a predetermined number of preceding payload packets, said predetermined number being greater than 1, said payload packet PL[k] and said forward error correction code FEC[k] defining, in combination, a data packet P[k]; and a second segment for transmitting a sequence of said data packets from a first device in said digital transmission system to a second device in said digital transmission system.

15. An apparatus as claimed in claim 14, wherein said first segment comprises a set of machine language instructions stored in said memory and executable by said computer processor.

16. An apparatus as claimed in claim 14, further comprising a third segment operated by said second device for recreating a lost payload packet PL[j] by a process comprising extracting information from one or more other packets.

17. An apparatus as claimed in claim 16, wherein said third segment comprises a set of machine language instructions stored in said memory and executable by said computer processor.

18. An apparatus as claimed in claim 14, wherein said predetermined number defines a maximum number of lost payload packets in a row that may be recovered.

19. An apparatus as claimed in claim 14, wherein said payload represents a real-time media signal.

20. An apparatus as claimed in claim 19, wherein said payload represents a voice signal.

21. An apparatus for transmitting payload in a digital communications system, said payload being divided into a sequence of payload packets, PL[k−w], ... , PL[k−1], PL[k−2], PL[k], PL[k+1], ... , PL[k+u], said apparatus comprising, in combination:

a first segment for generating, for each payload packet PL[k], a forward error correction code FEC[k]=PL[k−1] XOR PL[k−2] XOR ... , XOR PL[k−w];

a second segment for appending said forward error correction code FEC[k] to said payload packet PL[k], said payload packet PL[k] and forward error correction code FEC[k] defining, in combination, a packet P[k]; and a third segment for transmitting a sequence of said packets from a first location in said digital transmission system to a second location in said digital transmission system, whereby, when said sequence of packets is transmitted from said first location in said digital communications system to said second location in said digital communications system, if a packet P[i] is lost in said transmission, payload packet PL[i] may be recreated by extracting PL[i] from one or more other packets.

22. An apparatus as claimed in claim 21, wherein said first and second segments each comprise a set of machine language instructions stored in a memory and executable by a computer processor.

23. An apparatus as claimed in claim 21, wherein said payload represents a real-time media signal.

24. An apparatus as claimed in claim 23, wherein said payload represents a voice signal.

* * * * *